(12) United States Patent
Koplow

(10) Patent No.: US 9,261,100 B2
(45) Date of Patent: Feb. 16, 2016

(54) AXIAL FLOW HEAT EXCHANGER DEVICES AND METHODS FOR HEAT TRANSFER USING AXIAL FLOW DEVICES

(75) Inventor: Jeffrey P. Koplow, San Ramon, CA (US)

(73) Assignee: Sandia Corporation, Albuquerque, NM (US)

( * ) Notice: Subject to any disclaimer, the term of this patent is extended or adjusted under 35 U.S.C. 154(b) by 788 days.

(21) Appl. No.: 13/409,956

(22) Filed: Mar. 1, 2012

(65) Prior Publication Data

US 2012/0180992 A1    Jul. 19, 2012

Related U.S. Application Data

(63) Continuation-in-part of application No. 12/856,440, filed on Aug. 13, 2010.

(60) Provisional application No. 61/448,649, filed on Mar. 2, 2011.

(51) Int. Cl.
*F28D 11/02*    (2006.01)
*F28D 11/04*    (2006.01)
(Continued)

(52) U.S. Cl.
CPC .......... *F04D 25/0606* (2013.01); *F04D 25/066* (2013.01); *F04D 25/0613* (2013.01);
(Continued)

(58) Field of Classification Search
CPC .......... F28D 11/02; F28D 11/04; F28D 5/02; F28D 15/02; F28D 15/0208; F28D 15/0233; F28D 2015/0291; F04D 29/582; F04D 29/5826; F04D 29/5853; F04D 29/056; F04D 29/0563; F04D 29/057

USPC .............. 165/81–83, 85–87, 89, 91–92, 165/121–122, 104.25, 104.26, 104.21, 165/104.31

See application file for complete search history.

(56) References Cited

U.S. PATENT DOCUMENTS 3,376,083 A    4/1968  Everhardus
3,621,908 A *  11/1971 Pravda ............................ 165/86
(Continued)

FOREIGN PATENT DOCUMENTS

CN    1987661 A    6/2007
EP    0 029 667 A1    6/1981
(Continued)

OTHER PUBLICATIONS

International Search Report & Written Opinion dated Dec. 24, 2009 for PCT/US2009/044550.
(Continued)

*Primary Examiner* — Allen Flanigan
*Assistant Examiner* — For K Ling
(74) *Attorney, Agent, or Firm* — Dorsey & Whitney LLP

(57) ABSTRACT

Systems and methods described herein are directed to rotary heat exchangers configured to transfer heat to a heat transfer medium flowing in substantially axial direction within the heat exchangers. Exemplary heat exchangers include a heat conducting structure which is configured to be in thermal contact with a thermal load or a thermal sink, and a heat transfer structure rotatably coupled to the heat conducting structure to form a gap region between the heat conducting structure and the heat transfer structure, the heat transfer structure being configured to rotate during operation of the device. In example devices heat may be transferred across the gap region from a heated axial flow of the heat transfer medium to a cool stationary heat conducting structure, or from a heated stationary conducting structure to a cool axial flow of the heat transfer medium.

8 Claims, 8 Drawing Sheets

(51) Int. Cl.
  *F28D 5/02* (2006.01)
  *F28D 15/02* (2006.01)
  *F04D 29/056* (2006.01)
  *F04D 29/057* (2006.01)
  *F04D 25/06* (2006.01)
  *F04D 29/58* (2006.01)
  *F28F 3/02* (2006.01)
  *F28F 13/12* (2006.01)
  *H01L 23/467* (2006.01)
  *H05K 7/20* (2006.01)
  *F28F 13/02* (2006.01)
  *F28D 7/00* (2006.01)

(52) U.S. Cl.
  CPC .......... *F04D29/582* (2013.01); *F04D 29/5853* (2013.01); *F28D 7/0016* (2013.01); *F28D 15/025* (2013.01); *F28D 15/0208* (2013.01); *F28D 15/0233* (2013.01); *F28F 3/02* (2013.01); *F28F 13/02* (2013.01); *F28F 13/125* (2013.01); *H01L 23/467* (2013.01); *H05K 7/20163* (2013.01); *F28F 2215/06* (2013.01); *F28F 2250/08* (2013.01); *H01L 2924/0002* (2013.01)

(56) References Cited

U.S. PATENT DOCUMENTS

| | | | |
|---|---|---|---|
| 3,842,596 A * | 10/1974 | Gray | 60/736 |
| 3,844,341 A | 10/1974 | Bimshas, Jr. et al. | |
| 3,882,335 A * | 5/1975 | Fries | 310/61 |
| 3,888,304 A * | 6/1975 | Laing | 165/86 |
| 3,999,400 A * | 12/1976 | Gray | 62/115 |
| 4,021,050 A * | 5/1977 | Powers | 277/431 |
| 4,125,375 A | 11/1978 | Hunter | |
| 4,156,570 A | 5/1979 | Wardlaw | |
| 4,164,690 A | 8/1979 | Muller et al. | |
| 4,165,472 A * | 8/1979 | Wittry | 378/127 |
| 4,282,464 A | 8/1981 | Uzuka | |
| 4,380,355 A | 4/1983 | Beardmore | |
| 4,554,071 A | 11/1985 | Ruijten et al. | |
| 4,683,579 A | 7/1987 | Wardlaw | |
| 5,000,254 A | 3/1991 | Williams | |
| 5,197,858 A | 3/1993 | Cheng | |
| 5,279,936 A | 1/1994 | Vorpahl | |
| 5,283,488 A * | 2/1994 | Ponnappan et al. | 310/55 |
| 5,296,775 A | 3/1994 | Cronin et al. | |
| 5,297,623 A | 3/1994 | Ogushi et al. | |
| 5,303,565 A * | 4/1994 | Pravda | 62/476 |
| 5,335,143 A | 8/1994 | Maling | |
| 5,422,787 A | 6/1995 | Gourdine | |
| 5,583,746 A | 12/1996 | Wang | |
| 5,616,974 A | 4/1997 | Yamada | |
| 5,635,362 A | 6/1997 | Levine et al. | |
| 5,727,928 A | 3/1998 | Brown | |
| 5,736,787 A | 4/1998 | Larimer | |
| 5,794,687 A | 8/1998 | Webster et al. | |
| 5,957,659 A | 9/1999 | Amou et al. | |
| 5,963,887 A | 10/1999 | Giorgio | |
| 5,979,541 A | 11/1999 | Saito | |
| 6,050,326 A | 4/2000 | Evans et al. | |
| 6,078,468 A | 6/2000 | Fiske | |
| 6,153,579 A | 11/2000 | Kim et al. | |
| 6,175,495 B1 | 1/2001 | Batchelder | |
| 6,194,798 B1 | 2/2001 | Lopatinsky | |
| 6,249,071 B1 | 6/2001 | Lopatinsky et al. | |
| 6,319,469 B1 | 11/2001 | Mian et al. | |
| 6,356,435 B1 | 3/2002 | Davis | |
| 6,379,974 B1 | 4/2002 | Parce et al. | |
| 6,384,507 B1 * | 5/2002 | Lee et al. | 310/211 |
| 6,392,720 B1 | 5/2002 | Kim | |
| 6,457,955 B1 | 10/2002 | Cheng | |
| 6,502,989 B1 | 1/2003 | Takeuchi et al. | |
| 6,510,684 B2 * | 1/2003 | Matsunaga | 60/39.511 |
| 6,525,938 B1 | 2/2003 | Chen | |
| 6,545,438 B1 | 4/2003 | Mays, II | |
| 6,619,385 B2 | 9/2003 | Watanabe et al. | |
| 6,623,860 B2 | 9/2003 | Hu et al. | |
| 6,638,408 B1 | 10/2003 | Speicher et al. | |
| 6,659,169 B1 | 12/2003 | Lopatinsky et al. | |
| 6,664,673 B2 | 12/2003 | Lopatinsky et al. | |
| 6,685,809 B1 | 2/2004 | Jacobson et al. | |
| 6,860,323 B2 | 3/2005 | Cheng | |
| 6,873,069 B1 | 3/2005 | Odagiri et al. | |
| 6,876,550 B2 | 4/2005 | Sri-Jayantha et al. | |
| 6,879,120 B2 | 4/2005 | Xi | |
| 6,885,555 B2 | 4/2005 | Greco | |
| 6,955,215 B2 | 10/2005 | Al-Garni et al. | |
| 6,960,449 B2 | 11/2005 | Wang et al. | |
| 6,966,357 B1 | 11/2005 | Herbert | |
| 7,021,894 B2 | 4/2006 | Lopatinsky et al. | |
| 7,033,747 B2 | 4/2006 | Gordon et al. | |
| 7,035,102 B2 | 4/2006 | Holmes | |
| 7,044,202 B2 | 5/2006 | Lopatinsky et al. | |
| 7,055,581 B1 | 6/2006 | Roy | |
| 7,071,587 B2 | 7/2006 | Lopatinsky et al. | |
| 7,100,677 B2 | 9/2006 | Lee et al. | |
| 7,134,839 B2 | 11/2006 | Horng et al. | |
| 7,136,285 B1 | 11/2006 | Herbert | |
| 7,157,049 B2 | 1/2007 | Valencia et al. | |
| 7,165,413 B2 | 1/2007 | Symons | |
| 7,165,938 B2 | 1/2007 | Lee et al. | |
| 7,168,918 B2 * | 1/2007 | Balan et al. | 415/208.2 |
| 7,265,975 B2 | 9/2007 | Tsai | |
| 7,267,526 B2 | 9/2007 | Hsu et al. | |
| 7,273,091 B2 * | 9/2007 | Bahl et al. | 165/121 |
| 7,284,596 B2 | 10/2007 | Larson | |
| 7,301,771 B2 | 11/2007 | Hata et al. | |
| 7,304,845 B2 | 12/2007 | Xia | |
| 7,312,085 B2 | 12/2007 | Chou et al. | |
| 7,324,339 B2 | 1/2008 | Foster, Sr. | |
| 7,349,212 B2 | 3/2008 | Xia | |
| 7,381,027 B2 | 6/2008 | Kaneko et al. | |
| 7,455,501 B2 | 11/2008 | Horng et al. | |
| 7,458,413 B2 | 12/2008 | Mok | |
| 7,481,263 B2 | 1/2009 | Breier et al. | |
| 7,520,314 B2 | 4/2009 | Hwang | |
| 7,543,457 B2 | 6/2009 | Crocker et al. | |
| 7,667,969 B2 | 2/2010 | Khanna et al. | |
| 7,670,102 B2 | 3/2010 | Chang et al. | |
| 7,683,509 B2 * | 3/2010 | Neal | 310/54 |
| 7,695,256 B2 | 4/2010 | Horng et al. | |
| 7,758,810 B2 | 7/2010 | Lee et al. | |
| 7,836,939 B2 | 11/2010 | Zimmerman et al. | |
| 7,896,611 B2 | 3/2011 | Khanna et al. | |
| 7,900,690 B2 | 3/2011 | Hawwa et al. | |
| 7,905,712 B2 | 3/2011 | Huang | |
| 7,911,791 B2 | 3/2011 | Refai-Ahmed et al. | |
| 8,337,775 B2 | 12/2012 | Pugia et al. | |
| 8,365,810 B2 * | 2/2013 | Xu et al. | 165/80.2 |
| 2001/0055812 A1 | 12/2001 | Mian et al. | |
| 2002/0090307 A1 | 7/2002 | Cheng | |
| 2002/0098535 A1 | 7/2002 | Wang et al. | |
| 2002/0153251 A1 | 10/2002 | Sassi et al. | |
| 2002/0164659 A1 | 11/2002 | Rao et al. | |
| 2002/0170825 A1 | 11/2002 | Lee et al. | |
| 2003/0013203 A1 | 1/2003 | Jedrzejewski et al. | |
| 2003/0124719 A1 | 7/2003 | Woodside | |
| 2003/0203504 A1 | 10/2003 | Hefti | |
| 2003/0221963 A1 | 12/2003 | Bjellqvist et al. | |
| 2004/0035556 A1 | 2/2004 | Jean | |
| 2004/0072278 A1 | 4/2004 | Chou et al. | |
| 2004/0109291 A1 | 6/2004 | Kannmacher | |
| 2004/0114327 A1 | 6/2004 | Sri-Jayantha et al. | |
| 2004/0119354 A1 | 6/2004 | Takada | |
| 2005/0002163 A1 | 1/2005 | Lopatinsky | |
| 2005/0087445 A1 | 4/2005 | Speicher et al. | |
| 2005/0195573 A1 | 9/2005 | Huang | |
| 2005/0274490 A1 | 12/2005 | Larson | |
| 2006/0007656 A1 | 1/2006 | Symons | |
| 2006/0021735 A1 | 2/2006 | Lopatinsky | |
| 2006/0171654 A1 | 8/2006 | Hawkins et al. | |
| 2006/0191792 A1 | 8/2006 | Herr et al. | |

(56) References Cited

U.S. PATENT DOCUMENTS

| | | | |
|---|---|---|---|
| 2007/0000268 | A1 | 1/2007 | Crocker et al. |
| 2007/0041158 | A1 | 2/2007 | Hornung |
| 2007/0231419 | A1 | 10/2007 | Pelcz et al. |
| 2008/0069706 | A1 | 3/2008 | Huang |
| 2008/0149484 | A1 | 6/2008 | Tolley et al. |
| 2009/0145584 | A1 | 6/2009 | Walsh et al. |
| 2009/0166004 | A1 | 7/2009 | Lai et al. |
| 2010/0068754 | A1 | 3/2010 | Kirakossian |
| 2010/0177480 | A1 | 7/2010 | Koplow |
| 2010/0328887 | A1 | 12/2010 | Refai-Ahmed et al. |
| 2011/0103011 | A1 | 5/2011 | Koplow |

FOREIGN PATENT DOCUMENTS

| | | | |
|---|---|---|---|
| FR | 2551192 A1 * | 3/1985 | |
| JP | 407169887 A1 | 7/1995 | |
| JP | 2000-054978 | 2/2000 | |
| JP | 2000/054978 | 2/2000 | |
| JP | 2006-037918 | 2/2006 | |
| WO | WO01/68225 A1 | 9/2001 | |
| WO | WO 2006117578 A1 | 11/2006 | |
| WO | WO2010/016963 A1 | 2/2010 | |

OTHER PUBLICATIONS

Satomi, et al., "Design Optimization of Spirally Grooved Thrust Air Bearings for Polygon Mirrow Laser Scanners", The Japan Society of Mechanical Engineers, Series C, vol. 36(3), Sep. 15, 1993, 393-399.
Cui, Huanchun et al., "Multistage Isoelectric Focusing in a Polymeric Microfluidic Chip", Analytical Chemisty, Dec. 15, 2005, pp. 7878-7886, vol. 77, No. 24.
Czeiger, D. et al., "Measurement of Circulating Cell-Free DNA Levels by a New Simple Fluorescent Test in Patients with Primary Colorectal Cancer," Am. J. Clin. Pathol., 2011, vol. 135, pp. 264-270.
Folgea, D. et al., "Detecting Single Stranded DNA with a Solid State Nanopore", Nano Letters, 2005, vol. 5, No. 10, pp. 1905-1909.
Supplementary European Search Report for Application No. 09805311.9-1959 / 2329337 (PCT/US2009044550), dated Mar. 14, 2007 (Sandia National Laboratories, Applicant).
Abi-Samira, K. et al., "Infrared Controlled Waxes for Liquid-Handling and Storage on a CD-Microfluidic Platform", The Royal Society of Chemistry, Lab Chip, 2011, pp. 723-726.
Albrecht, J W. et al., "Micro Free-Flow IEF Enhanced by Active Cooling and Functionalized Gels", Electrophoresis, 2006, pp. 4960-4969, vol. 27.
Amersham, M. "Percoll: Methodology and Applications", 2001, pp. 1-84.
Baldwin, Robert L., "How Hofmeister Ion Interactions Affect Protein Stability," Biophysical Journal, vol. 71, Oct. 1996, pp. 2056-2063.
Boyko, M. et al., "Cell-Free DNA—A Marker to Predict Ischemic Brain Damage in a Rat Stroke Experimental Model," J. Neurosurg. Anesthesiol. vol. 23, No. 3, Jul. 2011, pp. 222-228.
Cabrera, C R. et al., "Formation of Natural pH Gradients in a Microfluidic Device under Flow Conditions: Model and Experimental Validation", Analytical Chemistry, 2001, pp. 658-666, vol. 73.
Cui, Huanchun et al., "Multistage Isoelectric Focusing in a Polymeric Microfluidic Chip", Analytical Chernisty, Dec. 15, 2005, pp. 7878-7886, vol. 77, No. 24.
Curtis, R.A. et al., "A Molecular Approach to Bioseparations: Protein-Protein and Protein-Salt Interactions," Chemical Engineering Science, 2006, vol. 61, pp. 907-923.
Czeiger, D. et al., "Measurement of Circulating Cell-Free DNA Levels by a New Simple Fluorescent Test in Patients with Primary Colorectal Cancer," Am. J, Clin. Pathol., 2011, vol. 135, pp. 264-270.
Das, C. et al., "Effects of Separation Length and Voltage on Isoelectric Focusing in a Plastic Microfluidic Device", Electrophoresis, 2006, pp. 3619-3626, vol. 27.
Folgea, D. et al., "Detecting Single Stranded DNA with a Solid State Nanopore", Nano Letters, 2005, vol. 5, No, 10, pp. 1905-1909.

Glorikian, H. et al,, "Overview of Microfluidic Applications IN IVDS", DX Direction 1, 2010, pp. 12-16.
Glorkian, H. et al., "Smart-Consumables Product Development Strategy: Implications for Molecular Diagnostics", DX Direction, 2010, 12-16.
Goldshtein, H., et al., "A Rapid Direct Fluorescent Assay for Cell-Free DNA Quantification in Biologicel Fluids," Annals of Clinical Biochemistry, 209, vol. 46, 488-494.
Gorg, A et al., "Recent Developments in Two-Dimensional Gel Electrophoresis with Immobilized pH Gradients: Wide pH Gradients Up To pH 12, Longer Separation Distances and Simplified Procedures", Electrophoresis, vol. 20, 1999, 712-717.
Gorg, A. et al., "The Current State of Two-Dimensional Electrophoresis with Immobilized Gradients", Electrophoresis, vol. 21, 2000, pp. 1037-1053.
Hatch, A. V. et al., "Integrated Preconcentration SDS-PAGE of Proteins in Microchips Using Photopatterned Cross-Linked Polyacrylamide Gels", Analytical Chemistry, vol. 78, 2006, pp. 4976-4984.
Herr, A. E. et al., "Microfluidic Immunoassays as Rapid Saliva-Based Clinical Diagnostics", PNAS, vol. 104, No. 13, 2007, pp. 5268-5273.
Herr, A. E. et al., "On-Chip Coupling of Isoelectric Focusing and Free Solution Electrophoresis for Multidimensional Separations", Analytical Chemistry, vol. 75, 2003, pp. 1180-1187.
Holmes, D., et al., "Leukocyte Analysis and Differentiation Using High Speed Microfluidic Singe Cell Impedance Cytometry", Lab Chip 9, 2009, pp. 2881-2889.
Huang, T. et al., "Microfabrication of a Tapered Channel for Isoelectric Focusing with Thermally Generated pH Gradient", Electrophoresis, vol. 23, 2002, pp. 3504-3510.
International Search Report dated Dec. 24, 2009 for PCT/US2009/044550.
International Search Report dated Mar. 1, 2012 for PCT/US2012/027299.
Invitrogen Life Technologies, Instructional Manual, ZOOM IEF Fractionator, Cat. Nos. ZF10001 & ZF10002, Version C, Jul. 2004, pp. 1-64.
Lim, P., et al., "Rapid isoelectric trapping in a micropreparative-scale multicompartment electrolyzer", Electrophoresis, 2007. vol. 28, pp. 1851-1859.
Lo, C T. et al., "Photoploymerized Diffusion-Defined Ployacrylamide Gradient Gels for On-Chip Protein Sizing", The Royal Society of Chemistry, Lab on a Chip, vol. 8, 2008, pp. 1273-1279.
Lo, Y, et al., "Plasma DNA as a Prognostic Marker in Trauma Patients", Clinical Chemistry 46:3, 2009, pp. 319-323.
Lee, B.S., et al., "A Fully Automated Immunoassay From Whole Bloon n a Disc"; Lab Chip 9, 2009, pp. 1548-1555.
Long, et al., "Integration of nanoporous membranes for sample filtration/preconcentration in microchip electrophoresis", Electrophoresis, 2004, pp. 4927-4934, vol. 27.
Madou, M., et al., "Lab on a CD"; Annu. Rev. Biomed. Eng. 8, 2006, pp. 601-628.
Maes, M., et al., "Comparison of Sample Fixation and the Use of LDS-751 or Anti-CD45 for Leukocyte Identification in Mouse Whole Blood for Flow Cytometry", Journal of Immunogical Methods, 2007, p. 1-13.
Min, J. et al., "Functional Integration of DNA Purification and Concentration into a Real Time Micro-PCR Chip," The Royal Society of Chemistry; Lab Chip, 2011, pp. 259-265.
O'Farrell, P. H. , "High Resolution Two-Dimensional Electrophoresis of Proteins", The Journal of Biological Chemistry, vol. 250, No. 9, 1975, pp. 4007-4021.
Ogle, et al., "Preparative-scale isoelectric trapping separations using a modified Gradiflow Unit", Journal of Chromatorgraphy A, 2002, vol. 979, pp. 155-161.
Price, C.P., et al., "Light-Scattering Immunoassay," Principles and Practice Immunoassay (Second Edition), 1997, Chap. 18, pp. 445-480.
Rhodes, A., et al., "Plasma DNA Concentration as a Predictor of Mortality and Sepsis in Critically Ill Patients," Critical Care, 2006, pp. 1-7.

(56) References Cited

OTHER PUBLICATIONS

Rider, T, et al., "AB Cell-Based Sensor for Rapid Identification of Pathogens"; wwwsciencemag.org; Science vol. 301; 2003, pp. 213-215.

Riegger, L., et al., "Read-Out Concepts for Multiplexed Bead-Based Flourescence Immunoassays on Centrifugal Microfluidic Platforms," Sensors and Actuators A 125, 2006, pp. 455-462.

Righetti, P G., "The Alpher, Bethe, and Gamow of IEF, the Alpha-Centaury of Electrokinetic Methodologies, Part II: Immobilized pH Gradients", Electrophoresis, 2007, pp. 545-555, vol. 28.

Righetti, P G., "The Alpher, Bethe, Gamow of Isoelectric Focusing, the Alpha-Centaury of Electrokinetic Methodologies. Part 1", Electrophoresis, 2006, pp. 923-938, vol. 27.

Schaff, U.Y., et al., "Whole Blood Immunoassay Based on Centrifugal Bead Sedimentation," Clinical Chemistry, 2011, vol. 57:5, pp. 753-761.

Sommer, G J. et al., "On-Chip Isoelectric Focusing Using Photopolymerized Immobilized pH Gradients", Analytical Chemistry, 2008, pp. 3327-3333, vol. 80.

Tan, W. et al., "Miniaturized Capillary Isoelectric Focusing in Plastic Microfluidic Devices", Electrophoresis, 2002, pp. 3638-3645, vol. 23.

Zhang, L., et al., "A New Biodosimetric Method: Branched DNA-Based Quantitative Detection of B1 DNA in Mouse Plasma," The British Journal of Radiology, 3, Aug. 2010, pp. 694-701.

Ziegler, A. et al., "Circulating DNA: A New Diagnostic Gold Mine?" Cancer Treatment Reviews, 2002, vol. 28, pp. 255-271.

Zilberstein, G. et al., "Parallel Isoelectric Focusing Chip", Proteomics, 2004, pp. 2533-2540, vol. 4.

Zilberstein, G. et al., "Parallel processing in the isoelectric focusing chip", Electrophoresis, 2003, vol. 24, pp. 3735-3744.

* cited by examiner

AXIAL FLOW HEAT EXCHANGER DEVICES AND METHODS FOR HEAT TRANSFER USING AXIAL FLOW DEVICES

CROSS-REFERENCE TO RELATED APPLICATION(S)

This application claims the benefit of the earlier filing date of provisional application No. 61/448,649, filed Mar. 2, 2011 entitled "High Performance Axial Flow Air Bearing Heat Exchanger," which application is hereby incorporated by reference in its entirety, for any purpose. This application is also a continuation in part of co-pending U.S. patent application Ser. No. 12/856,440, filed Aug. 13, 2010, which is incorporated herein by reference in its entirety, for any purpose.

STATEMENT REGARDING RESEARCH & DEVELOPMENT

The United States Government has a paid-up license in this technology and the right in limited circumstances to require the patent owner to license others on reasonable terms as provided for by the terms of contract No. DE-AC04-94AL85000 awarded by the U.S. Department of Energy to Sandia Corporation.

TECHNICAL FIELD

This application describes examples of heat exchanger devices, including systems and methods for transferring heat using axial flow devices.

BACKGROUND

Heat exchangers are devices used for the transfer of heat between two or more media. The media may be separated by a solid wall, so that they never mix, or they may be in direct contact. Heat exchangers are used in many mechanical systems, including heating, ventilation, and air conditioning (HVAC) systems.

The term HVAC (heating, ventilation, and air conditioning) generally refers to mechanical systems relating to indoor or automotive environmental comfort. HVAC systems are generally configured based on principles of thermodynamics, fluid mechanics, and heat transfer. Such mechanical systems typically include components such as ducts or pipes, pumps, valves and vents, and heat exchanger devices. Pumps are frequently used in order to transport a fluid from one place to another against forces exerted on the fluid, and heat exchangers are often used to transfer heat between multiple mediums. For example, in an HVAC system air circulates throughout the building envelope and is conditioned (heated, cooled, purified, etc.) as needed. Air ducts may be installed throughout the interior space of a building to move the air and to supply the conditioned air to a room (via outlet vents). Return ducts may be used to remove air (via return-air grilles) and direct the air to a heat exchanger device, where heat is either put into the system or extracted from the system to be dissipated into the exterior environment (e.g. outside of the building envelope).

In addition to being used for heating, refrigeration, and air conditioning, heat exchangers may be used in power plants, chemical plants, petroleum refineries, natural gas processing, and sewage treatment. Heat exchangers of varying scales and complexities may be implemented in mechanical devices and systems that require heat transfer. For example, a heat exchanger would typically be found in an internal combustion engine in which a circulating fluid known as engine coolant flows through radiator coils and air flows past the coils to cool the coolant and heat the incoming air. Examples of systems where heat dissipation would be desirable are various electro-mechanical systems, and electronics applications such as conventional computing systems. In a typical computing system which includes a CPU, one or more memory devices, and other circuitry, cooling of the CPU in particular may be an important design consideration.

BRIEF DESCRIPTION OF THE DRAWINGS

The accompanying drawings, which are incorporated into and form a part of the specification, illustrate one or more embodiments of the present application and, together with the description, serve to explain the principles of various embodiments.

The drawings are only for the purpose of illustrating various embodiments, and are not to be construed as limiting. In the drawings.

DETAILED DESCRIPTION OF PREFERRED EMBODIMENTS

Figure 1:
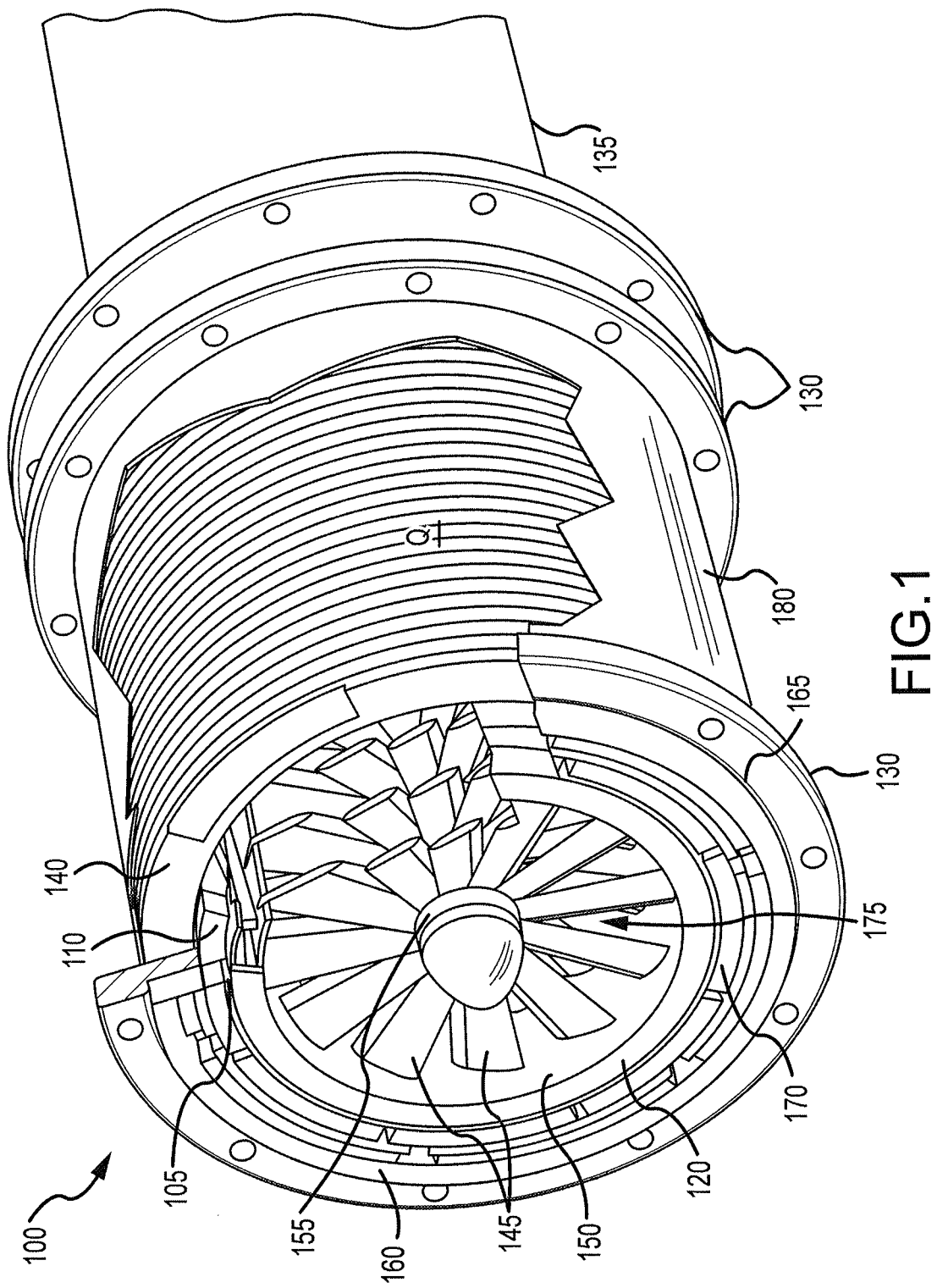
FIG. 1 is a schematic illustration of an axial flow heat exchanger according to an embodiment of the present invention.

Certain details are set forth below to provide a sufficient understanding of embodiments of the invention. However, it will be clear to one skilled in the art that embodiments of the invention may be practiced without various of these particular details. In some instances, well known structures and materials have not been shown in detail in order to avoid unnecessarily obscuring the described embodiments of the invention.

In many mechanical systems, heat transfer to and from components in the mechanical system may be desired. In some instances it may be desirable to extract heat from a system or an industrial process, such as in the case of some chemical processes and in the case of electrical devices, as described above. In other instances it may be desirable to input heat into a system, such as in the case of a heat engine. Often, it may be desirable to configure a system to either add or remove heat from a system, such as in the case of HVAC systems which are often configured to cool and to heat an interior space. In the context of HVAC systems, heat exchangers (e.g. condenser and evaporator coils) may be used to extract heat or deposit heat to the system. In such systems, and other thermodynamic systems, a working fluid may be used to transport heat from one location to another and ultimately to deposit heat outside of the system.

With respect to electronic devices, electrical circuits tend to generate heat, thus thermal management may be a significant issue for any devices employing electrical circuitry. Thermal management can be said to involve a two-step process, one being the step of heat extraction and the other being the step of heat rejection. Heat extraction may refer to the heat transfer from the thermal load (e.g. a given circuit component which during operation generates heat) to a heat conductive material (e.g. a plate of conductive material, a heat spreader, or a heat pipe). Heat rejection may refer to the heat transfer from the heat conductive material to a thermal reservoir, often being the surrounding air. That is, heat rejection in the case of electronic devices may be accomplished by the use of a finned metal heat sink, a fan, or a combination of the two.

Developments in the area of thermal management include the heat exchanger devices and methods described in co-pending U.S. Ser. No. 12/856,440, entitled "Heat Exchanger Device and Method for Heat Removal or Transfer", which application is incorporated herein by reference in its entirety for any purpose. The aforementioned application describes examples of forced-air heat exchangers, and describes radial flow devices configured to transfer heat across an air gap and dissipate the heat to the surrounding medium. For clarification purposes, in radial flow devices, a medium, which can be air or water, may enter through a center region (e.g. a suction eye of an impeller, for example) and may be expelled in an outward and radial direction around the perimeter of the radial flow device. Axial flow devices, as described herein, may maintain the axial direction of the flow. As would be understood by the skilled artisan, while the flow of the medium may generally be in an axial direction, there may be some components of flow that may not be strictly longitudinal, and there may even be some components perpendicular to the axis of rotation. However, generally speaking, the medium (e.g. air, water, etc.) would flow through the axial flow device in a substantially longitudinal direction (e.g. along the longitudinal axis of the device). This directionality can offer numerous advantages, some of which are discussed further below with respect to axial flow heat exchanger devices described herein.

Assemblies for transferring heat from a stationary structure to a rotary structure are described. In some examples, the assembly may include a stationary structure configured to be in thermal contact with a heat source, the stationary structure having a first surface, and a rotary structure coupled to the stationary structure using a gas bearing structure having low thermal resistance, the gas bearing structure having a gas-filled region between a second surface of the rotary structure and the first surface of the stationary structure, wherein the first surface and the second surface are substantially parallel to each other, and wherein the gas bearing structure is configured to prevent contact between the first surface and the second surface while the rotary structure is rotating.

In some examples, heat exchangers according to embodiments of the present disclosure may include a heat conducting structure which may be in thermal contact with a thermal load and which may have a surface disposed generally radially about the centerline of the heat exchanger. As would be understood, the centerline or center axis may be substantially parallel to a length of the heat exchanger. Accordingly, at least one surface of the heat conducting structure may be disposed about the centerline such that a heat transfer medium may flow substantially axially (e.g. along the center line) within the heat exchanger. In some examples the heat conducting structure and the heat transfer structure may be cylindrical. In some examples, other form factors may be used for implementing the heat conducting structure and the heat transfer structure.

The heat exchanger may also include a heat transfer structure which may be rotatably coupled to the heat conducting structure to form a gas-filled gap region between the above mentioned surface of the heat conducting structure and a second surface of the heat transfer structure. The heat transfer structure may be configured to rotate about the center and may be further configured to cause heat to transfer across the gas-filled gap region. In some examples, the heat exchanger may include a heat transfer medium flowing in a substantially axial direction (e.g., in a direction substantially along the length of the heat exchanger). As will be explained in further detail below, in some examples, heat may be transferred from the heat transfer medium across the gas-filled gap and to a cool heat conducting structure (e.g. heat flows inward towards the a cool object disposed about the center portion of the device). In some examples, heat may be transferred in the opposite direction. In some examples, heat may be transferred from a hot heat conducting structure across the gas-filled gap and to the heat transfer medium flowing axially through the heat transfer structure (e.g. heat flows inward towards a cool fluid/heat transfer medium located at the center region of the device).

In some examples, the heat conducting structure and/or the heat transfer structure may include a thermally conductive material and/or a heat pipe. In some examples, at least a portion of the heat transfer structure may be disposed inside the heat conducting structure. In some examples, at least a portion of the heat conducting structure is disposed inside the heat transfer structure.

In some examples, the gap region defined between a rotating surface of the heat transfer structure and a stationary surface of the heat conducting structure may include a gas, for example air. That is, in some examples the gas-filled gap region may be air-gap, which may be configured to operate as an air bearing. As will be understood and explained further below, the air bearing may be a dynamic air bearing in that it is a self-regulating (or self-pressurizing air bearing), or it may be a static air bearing in that it requires a source of pressurized gas. The gas in the gas-filled gap may be maintained at a pressure having sufficient magnitude to counteract or balance forces that may be applied to the rotating surface during rotation of the heat transfer structure. As can be understood and is further described below, during rotation an outer diameter of the heat transfer structure may increase thus closing the gap between the rotating and stationary surfaces. As such, the gas-filled gap region may be configured such that the two surfaces do not come into contact while the heat transfer structure rotates.

In some examples, the heat exchanger may include a motor coupled to the heat transfer structure and configured to rotate the heat transfer structure relative to the heat conducting structure about a common longitudinal axis of the heat conducting structure and the heat transfer structure. In some examples, the heat conducting structure may be a first cylinder, and the heat transfer structure may be a second cylinder having a plurality of structures adapted for the generation of axial flow, and wherein the second cylinder is disposed coaxially inside the first cylinder. The plurality of structures adapted for the generation of axial flow may be at least one of fins, vanes, blades, or combinations thereof.

In some examples, the heat exchanger may include a heat transfer structure which is a cylinder having a first wall and a second wall, the first wall being substantially parallel to the second wall and defining a first cylindrical region therebetween. The heat transfer structure may also include a plurality of hollow fins disposed inside the cylinder, the fins having a plurality of inner regions, wherein the fins are attached to the second wall of the cylinder such that at least one of the inner regions of the fins is interconnected with the first cylindrical region of the heat transfer structure. The first wall and the second wall may be connected by a cap, wherein the cap may be at least one of a bellows, a flexure, or a corrugated wall.

Heat exchangers and methods for transferring heat to or from a medium configured to flow substantially axially within a duct are described herein. In some examples, devices according to the present disclosure may include a first cylinder configured to be placed in thermal contact with a heat source, the first cylinder having a first surface extending along an inner portion of the first cylinder, and a second cylinder rotatably coupled to the first cylinder such that a gas-filled gap region is defined between the first surface of the first cylinder and a second surface of the second cylinder, the second cylinder having a plurality of fins arranged radially inside the second cylinder, wherein at least one of the plurality of fins is hollow defining a cavity therein, and wherein the second cylinder is further configured to rotate about a common axis of the first and second cylinders. In some examples, the gas-filled gap region may have a predetermined width when the second cylinder is at rest, and the device may be further configured to limit a change in the width of the gas-filled gap region during rotation of the second cylinder.

In some examples, methods for transferring heat to a medium configured to flow axially within a duct may include heating a heat conducting structure, wherein the heat conducting structure is coupled to a heat transfer structure to form a gas-filled gap region between the heat conducting structure and the heat transfer structure, and wherein the heat transfer structure is configured to rotate relative to the heat conducting structure. The method may also include rotating the heat transfer structure through a heat transfer medium configured to flow in an axial direction within the heat transfer structure, thereby transferring heat across the gas-filled gap region to the heat transfer structure.

In some examples, providing a heat conducting structure in thermal contact with a thermal load may include placing a heat source in physical contact with the heat conducting structure. In some examples, providing a heat conducting structure in thermal contact with a thermal load may include disposing at least one of a condenser coil or a heating element adjacent to the heat conducting structure. In some examples, providing a heat conducting structure in thermal contact with a thermal load may include heating a first surface of the heat conducting structure, wherein the heat conducting structure comprises at least one of a thermally conductive material or a heat pipe, and wherein the first surface is opposite and substantially parallel to the gas-filled gap region.

In some examples, transferring heat across the gas-filled gap region may include transferring heat across a region having a width selected to provide low thermal resistance. In some examples, transferring heat across the gas-filled gap region may include heating a second surface of the heat transfer structure to cause a working fluid interior to the heat transfer structure to boil. In some examples, transfer of heat may include heating a first region interior to the heat conducting structure. In some examples, transfer of heat may include heating an annular-shaped region exterior to the heat conducting structure. In some examples, transfer of heat may include transporting heat towards the centerline of the heat conducting structure. In some examples, and as will be discussed in more detail below, transfer of heat may include transporting heat towards a region located around the exterior perimeter of the heat conducting structure.

In some examples, rotating the heat transfer structure comprises rotating a cylindrical assembly having a plurality of fins thereby causing the heat transfer medium to flow in a generally axial direction. In some examples, rotating the heat transfer structure comprises rotating a cylindrical heat pipe having a plurality of hollow fins through the heat transfer medium. In some examples, rotating the heat transfer structure comprises applying a centrifugal force on a working fluid interior to the heat transfer to cause at least a portion of the working fluid to travel in an outwardly radial direction.

In some examples, providing a heat conducting structure in thermal contact with a thermal load may include heating a first cylindrical structure comprising a thermally conductive material, and wherein said transferring heat across the gas-filled gap region comprises transporting heat in a radially outward direction. In some examples, providing a heat conducting structure in thermal contact with a thermal load may include heating a cylindrical shaped structure comprising a thermally conductive material, and wherein said transferring heat across the gas-filled gap region comprises transporting heat in a radially inward direction.

Devices and methods according to embodiments of the present invention may be implemented to extract heat from a thermal load (e.g. electronic circuitry, a heater or a condenser coil, or any other heat source), dissipate the heat to a surrounding medium and/or transport the heat to a more desirable location. In some examples, the heat source may be any source of heat in a mechanical system, an electrical system, or an industrial processes, which is adapted to be in thermal contact with the heat conducting structure. In some examples, the heat conducting structure may be in direct physical contact with the heat source and configured to conduct heat away from the heat source. For example, the heat conducting structure may be a cylindrical enclosure made from a thermally conductive material such as metal. Axial flow devices of the scale as would be suited to HVAC applications for example, may be implemented to replace conventional heat exchangers and pumps in HVAC systems. In some examples, the heat conducting structure may be a vapor chamber. The vapor chamber may be implemented as a hollow evacuated chamber, which may be in thermal contact with a thermal load. The thermal load may be generated by any process or device outputting heat, such as a central processing unit (CPU) or other electrical devices, as examples. Other form factors may be implemented for the heat conducting structure as may be suitable for the specific thermal load which is sought to be managed. These and other embodiments and applications will be described further below and will be appreciated by those skilled in the art in view of the current disclosure. Thus, any detailed descriptions are presented for purposes of illustration only and are not intended to limit the scope of the present invention.

As will be described further below, the heat conducting and heat transfer structures may be rotatably coupled such that a gas-filled gap region is formed therebetween. For example, in the case of a cylindrical configuration, the heat conducting structure may be a cylindrical housing and the heat transfer structure may be a cylindrical shroud enclosing a plurality of fins. The cylindrical housing, (e.g. the outer cylinder of the assembly) may have a diameter which is slightly larger than the diameter of the cylindrical shroud (e.g. the inner cylinder of the assembly). In this manner the cylindrical shroud (e.g.

inner cylinder) may be disposed concentrically inside the outer cylinder to define a gas-filled gap region between the heat conducting structure and the heat transfer structure. The gas-filled gap region provides a freedom of rotation of the cylinders about their common center line. The gas-filled gap region may be configured such to have low thermal resistance. As such, during operation of the device, heat may be transferred across the gas-filled gap either inwardly towards the centerline of the axial flow device, or outwardly towards the exterior of the axial flow device, as described herein.

FIG. 1 shows a schematic illustration of an axial flow device according to an embodiment of the present invention. The axial flow device 100 may include a heat conducting structure 110, and a heat transfer structure 120 coupled to the heat conducting structure 110 using a gas bearing, which will be further described below. The gas bearing includes a gap region 105. The gas bearing may include one or more rolling contacts, such as ball bearings, described further below with respect to FIGS. 4 and 5.

In some examples, the axial flow device 100 may be implemented as a pair of cylindrical structures with a thin-walled and substantially cylindrical gap region defined therebetween. The heat conducting structure 110 may be implemented as an outer cylinder having an inner diameter $D_1$ and a length $L_1$. The heat transfer structure 120 may be implemented as an inner cylinder having an outer diameter $D_2$ and a length $L_2$. The outer diameter $D_2$ of the heat transfer structure 120 may be smaller than the inner diameter $D_2$ of the heat conducting structure 110, such that the inner cylinder may be disposed inside the outer cylinder. In this manner, the two cylinders may be coupled to form the gap region 105 sandwiched between the inner cylinder and outer cylinder.

Figure 4:
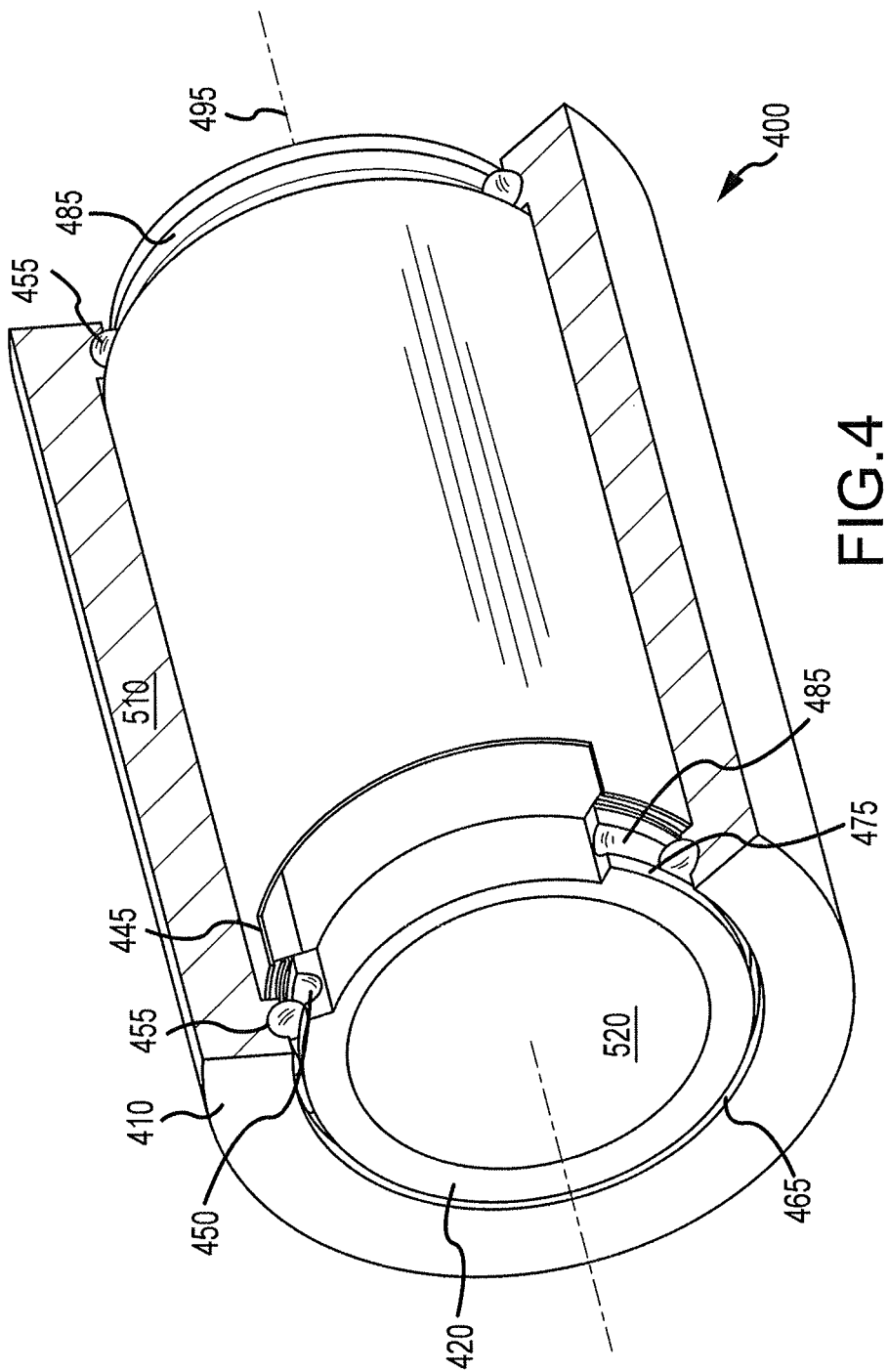
FIG. 4 is a schematic illustration of a cylindrical assembly depicting a cross-section of a gas-filled gap region and gas bearing according to an embodiment of the present invention.
Figure 5:
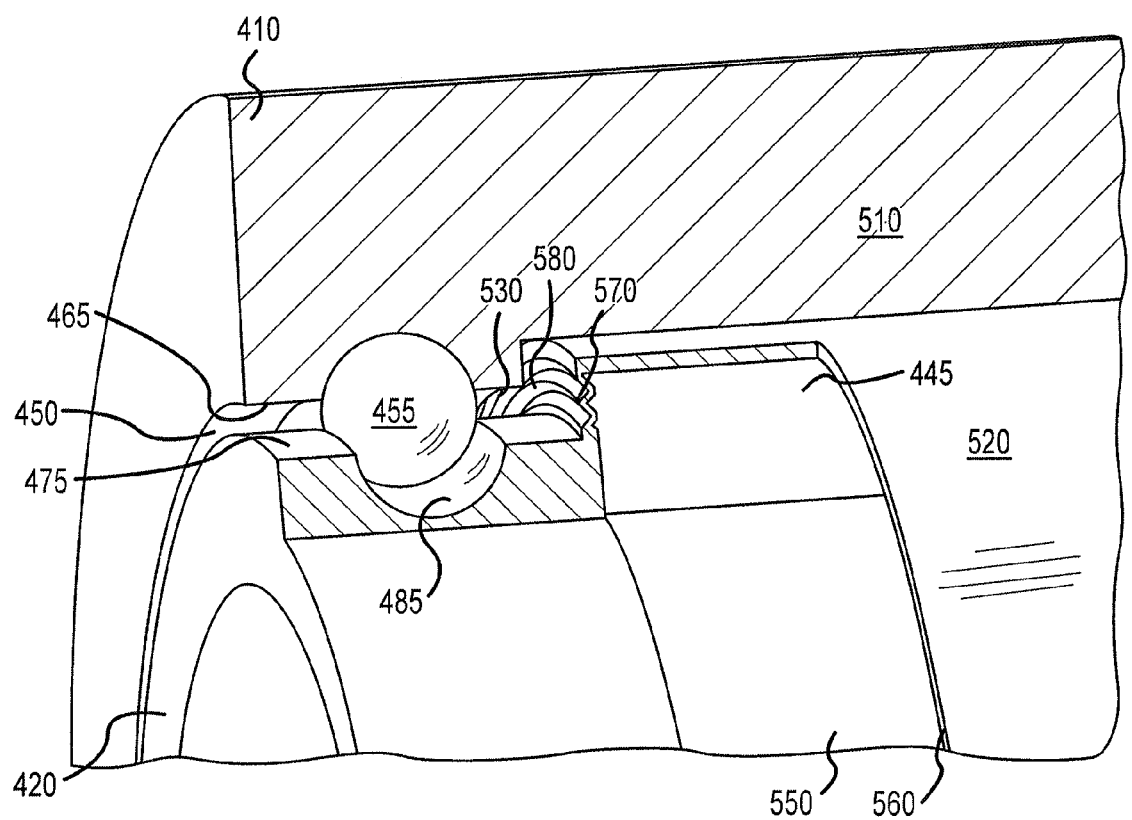
FIG. 5 is a close-up view of the gas-filled gap region and gas bearing depicted in FIG. 4.

The gap region 105, which will be described further in reference to FIGS. 4 and 5, provides rotational freedom between the heat conducting structure 110 and the heat transfer structure 120. That is, by virtue of the gap region sandwiched between the two cylinders, the outer cylinder (e.g. heat conducting structure 110) may remain stationary, while the inner cylinder (heat transfer structure 120) may rotate during operation of the device.

The heat transfer structure 120, which may be implemented as a cylindrical enclosure, may include a plurality of fins 145 and/or other structures adapted for the generation of axial flow. In some examples, the fins 145 may be implemented as any combination of fins, vanes, blades, plates or other structures configured to generate and/or facilitate axial flow of a heat transfer medium through the interior of the heat transfer structure 120. The fins 145 may be attached to the interior wall 150 of the cylindrical heat transfer structure 120. In some embodiments, the fins 145 may be attached to a shaft 155, which may run along the centerline of the cylindrical heat transfer structure 120. In some examples, the heat transfer structure may be implemented without a shaft, and the fins may extend radially inward and terminate at a point near the centerline of the heat transfer structure 120.

During operation, the cylindrical heat transfer structure 120 may be rotated about its axis of rotation. Rotational force may be provided by a motor 160, for example. The motor 160, in some examples, may be a brushless dc motor having a stator 165 and a rotor 170. The stator 165 and rotor 170 may be implemented as a pair of rings by any conventional methods known in the art. The stator 165 may be coupled to the stationary portion of the device (e.g. the heat conducting structure 110), and the rotor may be coupled to the rotating portion (e.g. the heat transfer structure 120). In some examples, rotational force (e.g. torque) may be provided by an external motor or other machines known in the art and adapted for power generation, and the force may be transmitted to the heat transfer structure via the shaft 155, for example. In some examples, rotation of the heat transfer structure 120 may be provided, at least in part, by the heat transfer medium flowing through the finned array inside the cylindrical heat transfer structure. That is, in some cases, flow of the heat transfer medium may be generated elsewhere and a portion of the flow energy may be used to rotate the finned heat transfer structure. As would be appreciated, other means of imparting rotation on the heat transfer structure 120 may be used without departing from the scope of the present disclosure.

For purposes of illustration, the operation of an exemplary heat transfer device according to the present disclosure will now be described briefly. As will be appreciated, heat from a heat source Q may be transferred to the heat conducting structure 110 by providing the heat source Q in thermal contact with the heat conducting structure 110. Accordingly, in the present example, the heat conducting structure 110 may be the hot end the system, while the interior of the heat transfer structure 120 may be the cool end. As is known in the art, heat flows from a location of high temperature to a location of lower temperature. Thus, heat from source Q may be conducted through the heat conducting structure 110 and across the gap region 105 towards the cool end, which, in the present example, may be the center region 175 of the heat transfer structure 120. The gap region 105, which may be implemented as a narrow gas-filled gap, may be configured to have low thermal resistance such that heat flows to the heat transfer structure substantially unimpeded. In addition, the heat transfer structure 120 may be configured to facilitate the transport of heat radially inward, as described herein.

In an exemplary HVAC application, the heat exchanger device 100 may be coupled via one or more flanges 130 to other components 135 of the HVAC system, such as ductwork, for example. In some examples, multiple axial flow heat exchanger devices 100 may be arranged in series to provide greater heat transfer capacity or different functionality at different locations along the fluidic loop, as may be desired. In some examples, the heat source Q may be a condenser coil 140 of a typical HVAC system. In some examples, the heat conducting structure 110 may be replaced altogether by the condenser coil 140. As is known in the art, a condenser coil may circulate a high pressure, high temperature gas and cause the gas to condense thereby rejecting heat to another medium. Accordingly, in the present example, heat rejected from the condenser coil may be transported towards the center of the heat transfer structure and transferred to another medium flowing through the heat transfer structure in a substantially axial direction. Subsequently, heat may then be transported to another desired location by flowing the heat transfer medium to that location.

As would be appreciated by those skilled in the art, axial flow heat exchanger devices as described herein may confer advantages over radial-flow devices known in the art. For example, in the context of an HVAC system, axial flow heat exchanger devices, such as device 100, may be coupled inline with a building's ductwork. Heat may be transferred inwardly to the center region 175 of the axial flow device. The rotation of the fin array may generate said axial flow thereby transporting the heated air can then be transported through the ductwork. In this manner, the rotating fins may provide some or all of the air movement functionality, thus minimizing or entirely obviating the need for additional pumps typically used in conventional HVAC systems.

In some examples, instead of a condenser coil, the heat source may be an electrical device, such as the CPU of a computer system. The heat transfer structure 120 may be enclosed in a vapor chamber. The vapor chamber may be implemented as a hollow evacuated chamber having a cross sectional profile as suited for the specific application. In some examples, the vapor chamber may have a shape complementary to the shape of the heat transfer structure, such that the heat transfer structure is enclosed in the vapor chamber. In some examples, the vapor chamber may have one or more surfaces that may be substantially flat such that the vapor chamber may be disposed on and mounted to other devices. For example, one or more exterior surfaces of the vapor chamber may be coupled to, or otherwise be in thermal contact with, a heat source, such as a CPU. Heat generated by the CPU may be transferred to the interior of the vapor chamber, in which the heat transfer structure is immersed. As can be appreciated in light of the examples described herein, various thermal loads may be effectively managed using embodiments of the present disclosure.

In some examples, the heat conducting structure 110 (e.g. outer cylinder) may be configured as a heat pipe. As is known in the art, and as will be described in more detail below, a heat pipe is a type of technology which utilizes the phase transition of a working fluid to transport heat efficiently. That is, a heat pipe may provide a low thermal resistance conductive path for heat transfer. A heat pipe may include a hollow structure made of a thermally conductive material, for example a metallic material such as copper, aluminum, or others, and may contain a fluid at a very low pressure. The fluid may be any suitable working fluid, such as water, ethanol, acetone, or others, and the fluid may be enclosed in the heat pipe at a partial vacuum (e.g. the hollow interior of the heat pipe may be evacuated with only a small fraction of a percent by volume of fluid enclosed). The partial vacuum in the heat pipe may facilitate fast transport of the heat carrying fluid (e.g. low thermal resistance). As would be appreciated by those skilled in the art, a heat pipe may be configured in virtually any form factor, thus, either or both the outer cylinder 110 and the inner cylinder 120, which will be described further below, may be implemented using heat pipe technology.

Figure 2:
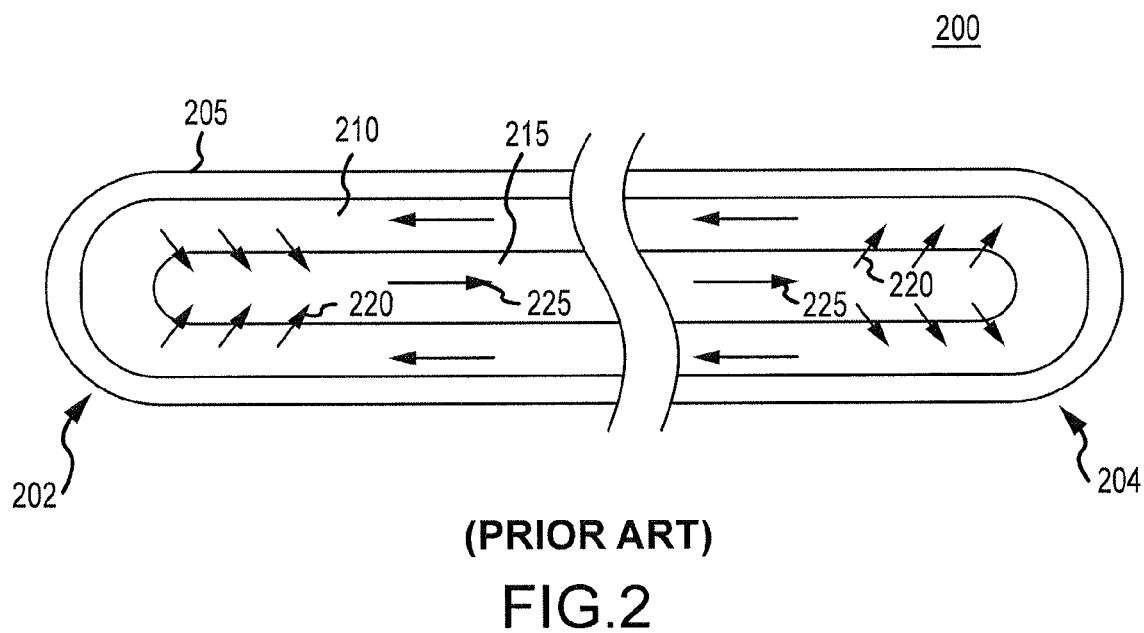
FIG. 2 is a schematic illustration of a heat pipe as is known in the art.

Heat transfer structures according to embodiments of the present disclosure may be implemented to incorporate heat pipe technology. FIG. 2 shows a schematic illustration of a heat pipe as is known in the art. The heat pipe 200 includes an enclosure 205 and wicking material 210 defining a cavity 215. The enclosure 205 is typically evacuated, sealed, and contains a predetermined quantity of working fluid. The heat pipe 200 has a higher temperature end 202 and a lower temperature end 204. At the higher temperature end 202, heat from the thermal load causes the working fluid to evaporate to vapor, as shown by arrows 220. The vapor may then travel along the heat pipe cavity 215 as shown by arrows 225. At the lower temperature end 204 of the heat pipe, the working fluid vapor condenses, releasing the latent heat of vaporization of the working fluid. The vapor may be absorbed by the wicking material 210, as shown by arrows 230. The condensed working fluid subsequently flows back to the hot end of the heat pipe by gravity and/or capillary absorption through the wicking material or other suitable structure. Suitable enclosures, wicking materials, and working fluids, are known in the art. Typical working fluids include water, ethanol, and acetone. At reduced pressure, such fluids boil at relatively low temperatures, which may be advantageous for overall heat pipe performance. Heat pipes generally may provide a low thermal resistance conductive path and may be used to transport heat from thermal loads to heat exchangers. The effective thermal conductivity of such a heat pipe may be many tens of times that of solid copper metal. The enclosure 205 and cavity 215 of heat pipes may vary in form factor, from tubular, to rectangular containers, to thin flat plates, for example.

Figure 3:
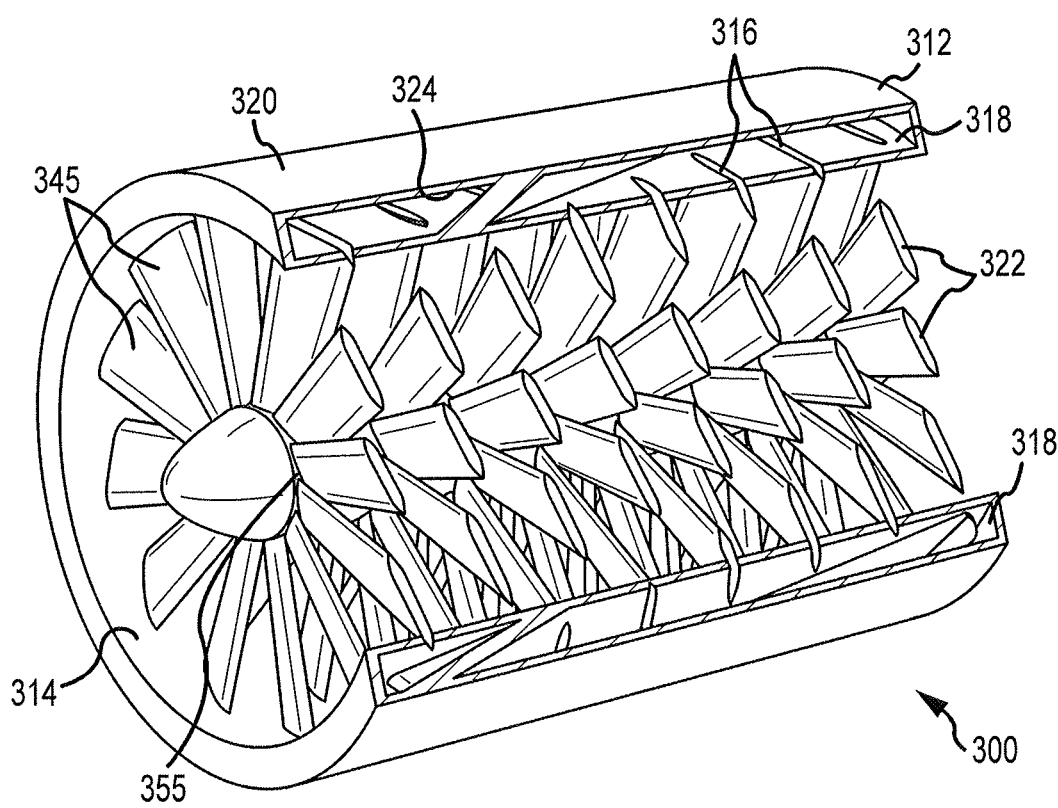
FIG. 3 is a schematic illustration with a partial cross-section of a heat transfer structure of an axial flow heat exchanger according to an embodiment of the present invention

FIG. 3 is a schematic illustration with partial cross-section of a heat transfer structure 300 according to an embodiment of the present invention. As previously mentioned, the heat transfer structure 300 may be implemented as a cylinder 320 having one or more fins 345 attached to an inner wall 314 of the cylinder 320. As described above, some embodiments may include a shaft 355 to which the fins 345 may be attached. As would be appreciated by those skilled in the art, the particular arrangement of the fin array may be modified to suit the specific application and desired performance. Thus, for example, the length, size, shape, spacing, and pitch of the fins 345, may be varied without departing from the scope of the present invention. Other form factors of the fins and/or heat transfer structure, in general, may also be implemented within the scope of the present disclosure.

In some examples, the heat transfer structure 300 may be configured to function as a heat pipe, such as for example, by implementing the heat transfer structure 300 as a double-walled cylindrical structure. For example, cylinder 320 may be hollow in conformity such that a cavity or hollow region 318 is defined between outer wall 312 and inner wall 314. The walls 312 and 314 may, as previously discussed, be made of a thermally conductive material, such as metal. One or more of the fins 345 may also be hollow, having a plurality of cavities or regions 322 in the interior of each respective hollow fin. The inner wall 314 of the cylinder 320 may include a plurality of slits, or openings 316 having a complementary shape to the cross-sectional profile of the fins. The fins may be attached to the inner wall 314 at each of the openings forming a network of interconnected channels therein. As would be understood, in this example, a fluid enclosed within the region 322 or regions 328 may be free to flow to any location of the combined space defined by the regions 322 and 318.

In some examples, one or more of the fins 345 may be implemented as individual heat pipes in that the hollow regions 322 within the respective fins do not interconnect with the cavity 318 defined in the interior of the cylinder 320. In such examples, working fluid which may be contained in a respective fin's regions 322 may not be allowed to flow into the cylindrical cavity 318. In some examples, it may be desirable to include features, such as ribs or other stiffening structures, inside cavity 318 for providing structural rigidity to cylinder 320, for example. Thus, the cavity 318 may be sub-divided into sub-sections, such that a working fluid may not flow freely through the entirety of the cavity 318. In other examples, cut-outs and other features may be implemented in the ribs so as to allow the working fluid to flow throughout the cavity 318 despite the inclusion of such ribs. As would be appreciated by those skilled in the art, many characteristics of the structural implementation of the heat transfer structure 300 may be varied without departing from the spirit and scope of the present disclosure.

Whether or not the components of the heat transfer structure 300 form a single heat pipe or a plurality of heat pipes, the advantages of configurations according to embodiments of the present invention would be apparent to those skilled in the art. As previously described with respect to conventional heat pipes, a wicking material 210, which is often costly, is typically needed to provide the capillary/wicking action which allows the fluid to move against forces such as gravity. In examples described herein, the need for using a wicking material may be partially or fully obviated by virtue of the centrifugal forces generated by the rotation of the heat transfer structure (as will be described in more detail below). While advantages which may be conferred by embodiments of the present invention may obviate the need for wicking materials or structures, in some examples wicking materials may nevertheless be included if desired. Furthermore, configuring the heat transfer structure as a heat pipe may substantially eliminate the internal thermal resistance of finned structures or other high surface area heat transfer structures typically used in the art.

In some examples, the finned array may be fabricated as a unitary structure. In some examples, individual fins 345 may be manufactured separately and assembled together to form the finned heat transfer structure 300. Each fin 345 may be implemented as a heat pipe in that it may have a hollow interior region 322. The fins 345 may be assembled into a finned array with relative ease using conventional fastening methods known in the art. For example, individual fins 345 may be attached to the surface 314 and/or the shaft 355 by welding, brazing, bolting, or by using any other conventional joint configurations or attachment methods known in the art. In some examples, the fins may be secured in their desired position within the assembly and the assembly of fins may be dip brazed together in a single step operation. In some examples, thermally conductive adhesive, such as thermal grease, may be used between the individual fins and the surface to which they are attached, such as the surface 314, for example. As would be understood by those skilled in the art, certain design parameters can be varied and materials can be selected to minimize the internal thermal resistance of the finned heat transfer structure 300 without departing from the scope of the present disclosure.

As can be appreciated, other configurations may be implemented and the flow direction may be altered or flow path narrowed, as desired for the particular application. Furthermore, and as described herein, rotary heat exchanger devices according to the present disclosure may be easily scaled for increased capacity. For example, parameters such as the diameter of the structures, their length, the specific design of the fins, and other characteristics can be varied within the scope of the present disclosure.

As previously described, the higher temperature end of a device implemented as a heat pipe according to embodiments of the present invention may be located about the exterior surface 312 of the cylinder 320, and the lower temperature end of the heat pipe may be distributed about the fins 345 of the heat transfer structure 300. In some embodiments, centrifugal pumping occurring inside the hollow, rotating heat exchanger transfer structure 300 may be used for fluid return of condensed vapor from the lower temperature end of the heat pipe to the higher temperature end of the heat pipe.

During operation, centrifugal force may be generated by a rotating heat transfer structure 300, which, for illustration purposes, is configured as the heat pipe described above. The centrifugal forces may cause the volume of working fluid contained in the cylindrical heat pipe structure to assume the form of a thin and substantially uniform layer of liquid in direct contact with the outer-most internal surfaces, which may be surface 324 of cylindrical wall 320, for example. Heat may be delivered to the wall 320 and correspondingly to surface 324 across the gas-filled gap region from a surrounding thermal load. Boiling at reduced pressure (e.g. the partial vacuum inside the heat pipe heat transfer structure 300) may generate a pressure gradient that actively transports vapor throughout the remainder of the hollow structure, including the fins 345. Vapor condensing on the internal surface of the fins 345 may then be centrifugally pumped in the outward radial direction to complete the operating cycle of the heat pipe.

As discussed above, conventional heat pipes rely on gravity and/or a capillary wick structure to provide a return mechanism for condensed vapor. Typically, the rate at which condensed working fluid can be returned to the hot end of a heat pipe places an upper limit on thermal load that can be accommodated by such a heat pipe (e.g. before the evaporation region of the heat pipe boils dry, resulting in loss of heat transfer ability of the heat pipe). In contrast, the centrifugal forces acting on liquid condensate in rotating heat transfer structures according to examples described herein may offer substantial advantages, such as a higher rate of return of working fluid to the hot end. A representative calculation assuming a cylindrical heat transfer structure with a 50-cm-diameter, and a 1200-rpm synchronous ac motor powering the rotation of the heat transfer structure, provides:

$$\frac{a}{a_g} = \frac{w^2 r}{a_g} = \frac{[2\pi(20 \text{ Hz})]^2 (0.25 \text{ m})}{9.8 \text{ ms}^{-2}} = 4.0 \times 10^2 \text{ g}$$

which indicates that the acceleration acting on the working fluid in the evaporation region would be on the order of 400 g and on the order of 100 g at the inner most radial position of each fin. This centrifugal return mechanism may allow the implementation of an ultra-high-performance heat pipe without the need for internal capillary structures (e.g. sintered metal coatings). Furthermore, as would be appreciated by those skilled in the art, long thin fins may be desirable in order to increase the surface area for heat transfer, however, in conventional heat transfer structures the design of the fins may be limited due to the decreasing thermal conductivity of thinner fins (e.g. the longer and thinner the fin, the greater the internal thermal resistance). Heat transfer structures according to embodiments of the present invention, which incorporate heat pipe technology and provide for centrifugal forces on the working fluid, may permit the use of long, thin, and ultra-high-aspect ratio fins, without sacrificing performance. The ability to implement such architecture may be advantageous to scaling of both device size and cooling performance.

FIGS. 4 and 5 (close-up view) show schematic illustrations of example cylindrical assemblies depicting a cross-section of a gas-filled gap region and gas bearing according to embodiments of the present disclosure. Partial illustration of an example heat conducting structure 410 and heat transfer structure 420 (depicted here for illustration purposes without the fins) are depicted. The heat conducting structure 410, which may be cylindrically shaped, and the heat transfer structure, also cylindrical in this example, may be arranged concentrically to form the cylindrical assembly 400 with center line 495. When so positioned, the pair of coaxial cylinders 510 and 520 may form a narrow gas-filled gap 450 which may allow the cylinders to rotate about the center line 495 without the inner surface 465 of cylinder 510 contacting outer surface 475 of cylinder 520. The assembly 400 may also include one or more roller bearings 455, or other conventional mechanical bearings known in the art. The roller bearings 455, seated in a groove 485, may provide rolling contact between a portion of the outer cylinder 510 and inner cylinder 520.

During operation, heat from a thermal load (the condenser coil of an HVAC system, for example) may be conducted in the inward radial direction to the gas-filled gap region 450, which in this case assumes the shape of a thin-walled cylinder. The cylindrical, stationary structure 410 may function as a thermal interface to the heat load (e.g. a heat spreader), and as a substantially rigid structure situated at one side of the gas-filled gap region. Cylinder 510 may be a solid cylinder, or it may be implemented as one or more heat pipes or other structures adapted to facilitate internal heat transfer and/or collection of heat from one or more thermal loads, as previously described. As mentioned above, the inner-most portion of this stationary structure (e.g. surface 465), where heat enters the gas-filled gap region, may be referred to as the stationary gap surface. The rotating heat transfer structures 420 (shown here without fins) may be a cylindrical assembly 520 having a plurality of structures adapted to the generation of axial flow, as previously described. As in other embodiments previously discussed, these structures may be adapted to the generation of flow and also provide the functionality of a finned heat sink. The outer-most portion of the rotating heat transfer structure (e.g. the surface 475), where heat exits the gas-filled gap region, may also be referred to as the rotating gap surface.

As previously described the cylindrical heat transfer structure 420 may be configured as a heat pipe. Accordingly, cylinder 520 may have a hollow interior defining region 445 between outer wall 560 and inner wall 550, which may in some examples, be partially filled with a working fluid. In some examples, the cylindrical portion of a heat transfer structure 420 configured as a heat pipe may essentially comprise a pair of thin-walled cylinders spaced apart from each other. In some examples, the walls 550 and 560 may be substantially parallel to each other. In some examples, portions of the walls 550 and 560 may be arranged at an angle with respect to each other.

The assembly 400 may include a self-regulating gas bearing which may, in some examples, be implemented as follows. The two walls 550 and 560 of cylinder 520 may be connected at each end by a cap 570 which may a flexure, a bellows, a corrugated wall, or any other structure providing similar functionality During operation of the device, when the heat transfer structure rotates, centrifugal forces may be applied to wall 560 and the cap 570 may expand in the outward direction. At sufficiently high rpm, outward expansion of the wall 560 may eventually be arrested by the hydrodynamic forces of the gas bearing 580. That is, at higher rpm, the wall 560 would be in closer proximity with the surface 465 (until arrested by the gas bearing) than during lower rpm or when the device is passive. In this manner, the gas-filled gap region 450 formed between the two cylinders 510 and 550 may be implemented as a self-regulating gas bearing. In some examples, the rotating cylinder 510 may also be supported by a conventional ball bearings 455 fitted into groove 485, as previously described. The air gap distance 530 may be selected to provide sufficient mechanical clearances, as desired, under non-operational conditions.

Size regulation of the gas-filled gap may be addressed by implementing the heat transfer structure 420 to include the self-regulating centrifugal flexure mechanism described above. As described herein, due to centrifugal loading on the heat transfer structure 420 when rotated at high speed, the heat transfer structure 420 may undergo elastic deformation in the radial direction. The amount of symmetric radial expansion as a function of angular velocity may be readily controlled by the mechanical design of the heat transfer structure 420 (e.g., by selecting suitable wall thickness of the tubular enclosure, the stiffness of the flexure or bellows connecting the walls, etc.). During operation, the opposing force of the pressurized gas-filled gap region may serve to eventually arrest further radial expansion of the heat transfer structure 420. Thus, this elastic deformation of the heat transfer structure 420 may be used advantageously to aid in the regulation of the gap size.

Other mechanisms, in addition to the radial flexure arrangement described herein, may be provide to prevent mechanical contact between the air gap surfaces during start up and shut down, when the hydrodynamic bearing may not be generating adequate pressure in the gap region to suspend the heat conducting structure. For example, when the axial flow heat transfer structure is at rest, no hydrodynamic pressure force may be generated, but a supporting bearing, for example, as described above, may be used to keep the heat transfer structure roughly centered with respect to the internal surface of the heat conducting structure. Under these circumstances, the air gap distance might be (for example) 0.1% of the radius of the axial-flow heat transfer structure, providing sufficient mechanical clearance. As described, when the heat transfer structure is rotated, the flexure mechanism described herein may expand by >0.1% at an operating speed of 2000 rpm (for example), and may serve to automatically regulate the air gap distance at high speed and automatically retract at low speed. As discussed further below, in the case of the radial-flow air bearing heat exchanger, the implementation of such a passive mechanism may incorporate additional parts.

Another approach to regulation of air gap distance, which may be used instead of or in conjunction with the methods described above, may be implemented as follows. In the some examples, at low speed, the air gap distance may be large and the frictional drag associated with shearing of the air in the air gap region may be very small. As the speed of rotation is increased, the air gap may begin to close because of centrifugal deformation of the heat transfer structure. Eventually, the width of the air gap may decrease to the point that the frictional drag associated with shearing of the air in the air gap region may be considerable. Accordingly, a torque-limiting clutch or other mechanisms adapted to limiting the maximum torque that may be transmitted from the motor to the rotating heat transfer structure may be implemented to prevent a further increase in angular velocity, thereby preventing a further increase in centrifugal deformation. In some embodiments an important function of the air bearing may be to keep the rotating heat transfer structure centered. That is, in some embodiments, the air bearing may be implemented to ensure that the air gap distance is substantially constant as function of angular position in the air gap region.

Example mechanisms adapted to provide torque limiting may include mechanical components, such as an eddy current torque limiting clutch. In some examples electronic components may be implemented to limit, for example, the maximum electrical voltage, current, and/or electrical power delivered to the motor. As described above, the torque associated with frictional drag in the air gap region may provide an adequate proxy for air gap distance. In some examples, air gap distance may be monitored by one or more distance sensors, and signals from such sensors may be used to adjust the rotational speed of the heat transfer structure so as to control air gap distance as described herein.

As can be appreciated by those skilled in the art, examples of structures and configurations as described herein, such as the structure shown in FIG. 3, may be compatible with various other structures commonly encountered in axial flow turbomachinery. For example, in a typical axial flow compressor, alternating rows of rotor and stator blades may be used to achieve a wide variety of desired pressure/flow characteristics and/or to provide improved efficiency. For example, such stator blades may be directed towards conversion of fluid kinetic energy in the axial and azimuthal direction (e.g. air flowing through and swirling in one or more portions of the axial flow device) into a pressure rise in the fluid. This process of converting kinetic energy to potential energy may be used, for example, to achieve high-compression ratio at high efficiency in an axial flow device having a compact form factor. As will be appreciated by those skilled in the art, examples of axial flow devices according to embodiments of the present invention may additionally incorporate features, such as stator blades. For example, as previously described the heat transfer structure 300 may be implemented such that the fins 345 do not attach to the center shaft 355. In such a configuration an array of stator blades may be attached to a stationary shaft 355. The fins 345 may be attached to the wall 314 of heat transfer structure 300, as previously described, and the fin and cylinder 320 assembly may be rotated by a motor coupled to the cylinder 320, as previously described. As will be appreciated, other configurations may of course be used without departing from the scope of the present disclosure. More generally, additional vanes, blades, diffuser structures, either stationary, or rotating, at different speed and/or different direction than the aforementioned hollow rotor blades may be incorporated as may be suitable for the particular application. Such additional structures (e.g., an array of stator blades) may be solid or hollow, and in some embodiments, may incorporate the functionality of a heat pipe. In some examples, heat pipes incorporated in axial flow devices may include a wicking material as previously described with regards to FIG. 2. As can be appreciated, devices according to the present disclosure may be compatible with numerous other variants of turbomachinery, such as multi-stage devices comprising a plurality rotating structures of different size, geometry, and rotation speed.

Other embodiments of the present invention may have one or more electronic components, such as a CPU, requiring thermal management housed inside the heat pipe cavity of a heat conducting structure. Placing a thermal load inside the heat pipe cavity may reduce or substantially eliminate problems related to establishing and maintaining a low thermal-resistance interface between the heat load(s) and the heat conducting structure(s). Such problems include the poor thermal conductivity of available heat sink pastes, greases, etc. in conjunction with the fact that a relatively thick layer of heat sink paste must be used in some embodiments to accommodate thermal expansion/contraction, thereby introducing substantial unwanted series thermal resistance. Further, the need for precise mechanical mating between the heat conducting structure and all of the electrical components that must be heat sunk may be problematic because the mechanical tolerances for mounting of electrical components to a printed circuit board may be relatively loose. Additionally, the tendency for thermal joint integrity to be compromised over time due to vibrations, mechanical stress, and/or thermal cycling may hamper efforts to maintain a low-thermal-resistance interface between a heat load and heat conducting structure.

In some examples, one or more gap surfaces, such as surfaces 465 and 475, as previously described, may incorporate one or more structures, such as a pattern of grooves, directed towards providing the functionality of a hydrodynamic gas bearing. As would be appreciated, a hydrostatic or hydrodynamic gas bearing may be implemented in example axial flow devices to provide the centering and/or desired rotational freedom. Hydrostatic gas bearings, for example, may be pressurized by an external gas source or by enclosing and sealing the gap region thereby maintaining the gas pressure therein. Hydrodynamic gas bearings may be self-pressurizing, which in some examples may be achieved by air or other gas being drawn into the gap region and pressurizing due to the rotation of the structure. Accordingly, in some examples, hydrodynamic gas bearing grooves may be inscribed on the stationary gap surface by a lithographically defined etching process.

Such a fabrication process may be conducted, for example, according to the following process: 1) a coating of photoresist may be applied to the stationary gap surface, 2) a thin-walled, high-reflectivity, cylindrical shell comprising a photo mask incorporating slots, holes, etc. that correspond to spiral grooves or other desired features to be etched into the stationary gap surface may be inserted and disposed over the stationary gap surface, 3) a UV lamp of cylindrical cross section, having an outer diameter smaller than the inner diameter of the photo mask, and length comparable to the length of photo mask, may be inserted collinearly with the axis of the photomask, 4) the resist may be exposed through the photomask, 5) the photo mask and UV lamp may be removed, 6) the UV-exposed portion of the photo resist may be dissolved (e.g. using an appropriate solvent), 7) etchant may be applied to the photo-resist-masked stationary gap surface for a predetermined period of time so as to etch the stationary gap surface to the desired depth, 8) the etchant may then be flushed away and/or neutralized, and 9) remaining (non-UV-exposed) photoresist may be dissolved away. Such a fabrication process, or a variant of such a process, may allow intricate and extensive surface features and/or patterns to be inscribed into the stationary gap surface accurately and inexpensively.

As would be appreciated, a hydrostatic or hydrodynamic gas bearing may be implemented in example axial flow devices to provide the centering and/or desired rotational freedom. Hydrostatic gas bearings, for example, may be pressurized by an external gas source and/or by enclosing and sealing the gap region to some extent, thereby helping to maintain the gas pressure therein. Hydrodynamic gas bearings may be self-pressurizing, which in some examples may be achieved by air or other gas being drawn into the gap region and being pressurized due to the rotation of the structure.

Figure 7:
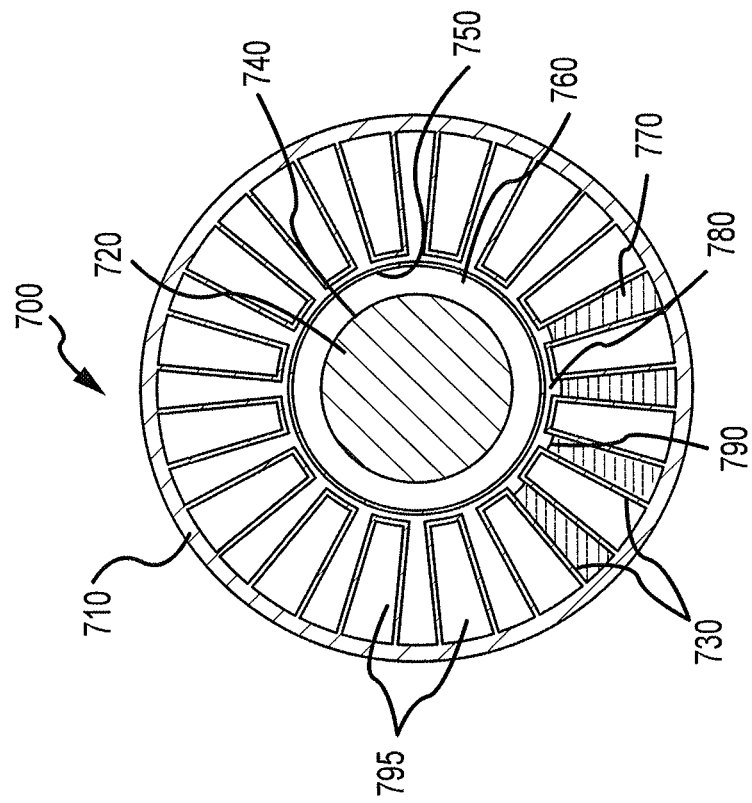
FIG. 7 is a cross-sectional illustration of an example axial flow heat exchanger configured to transfer heat from a heated stream to a cooler object.
Figure 6:
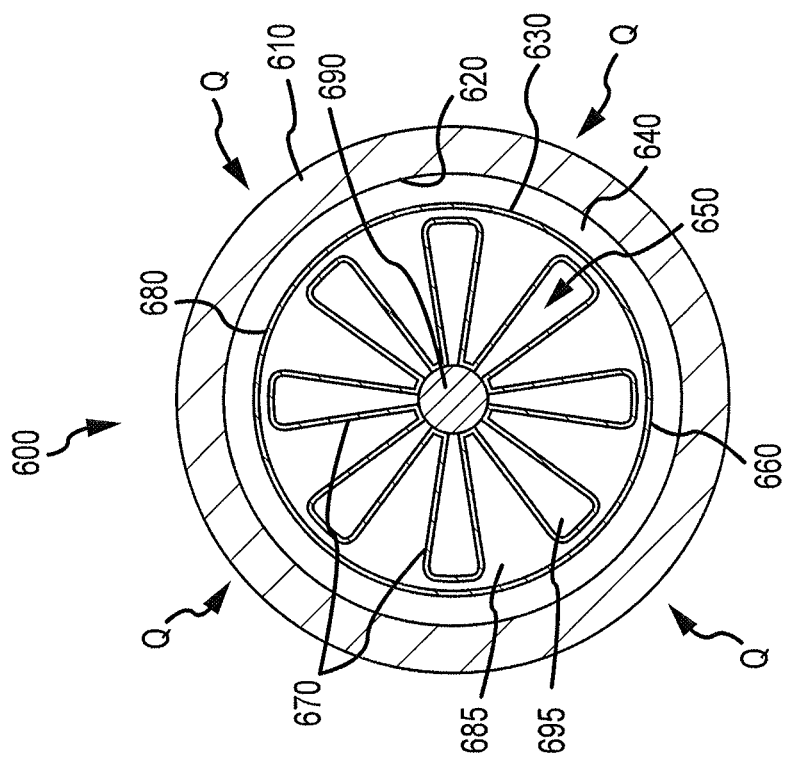
FIG. 6 is a cross-sectional illustration of an example axial flow heat exchanger configured to transfer heat from a heated object to a cooler stream.

In some embodiments, the higher and lower temperature ends of a heat pipe axial flow heat exchanger may be reversed in an implementation that preserves the advantage centrifugal pumping of condensed working fluid. For the purposes of illustration and comparison, FIGS. 6 and 7 depict simplified cross-sectional illustrations of example axial flow devices implementing heat exchangers according to embodiments described herein. FIG. 6 is a schematic cross-section of an axial flow heat exchanger configured to transfer heat in a generally inward radial direction from a heated object to a cooler stream flowing substantially axially through the device. An example axial flow heat exchanger 600 according to this configuration may include a heat conducting structure 610, which may be made of a solid thermally conductive material, or may be configured as a heat pipe, as previously described. The heat conducting structure 610 may be shaped as a cylinder having a stationary gap surface 620. A rotating gap surface 630 may be disposed opposite and substantially parallel to the stationary gap surface across the narrow gap 640 (note that gap 640 and other components in the schematic illustrations of FIGS. 6 and 7 are not to scale but are depicted for illustration purposes only).

In some examples the gap will have a width (e.g. along the transverse direction) selected such that it provides sufficient clearance while heat transfer structure rotates while still providing low thermal resistance. The heat transfer structure 680 may include a cylinder 660 and fins 670, which may be disposed interior to the gap 640 and configured to rotate about the cylinders' common centerline, spanning along shaft 690. The high temperature end in this example may be around the circumference of cylinder 610, as indicated by heat source Q, while the low temperature end may be the region 650 interior to cylinder 660 and surrounding shaft 690 and fins 670. The fins 670 may be configured as thin hollow structures defining a plurality of regions 685. In this manner, the fins may function as heat pipes while providing some or all of the flow generation functionality for causing the heat transfer medium to flow axially through region 695. In some examples, as described herein, the fins 670 may protrude from the wall of cylinder 660 into the region 695 without being attached to shaft 690. In some examples, stator blades may be interspersed between the fins into the region 695. In some examples, arrays of rotating fins and stationary fins may be alternated or otherwise arranged along the length of the shaft 690.

FIG. 7 depicts a cross-sectional illustration of a device configured to transfer heat from a warm air stream to a cold object (e.g. the heat conducting structure 720). As in the device of FIG. 6, the boundary layer thinning effect may provide for very effective heat transfer between the ambient air and/or other medium flowing through the ducted region and the surface of the hollow-fin structure. Such an "inside-out" configuration, the operation of which is described further below, may be implemented by changing the location of the air gap. While the gap region 640 in the device of FIG. 6 is located at the outer perimeter of the finned array 630, the gap region 760 in the example of FIG. 7 would be located at the inner perimeter of an annular-shaped heat transfer structure 710.

In the example depicted in FIG. 7, as in other examples described herein, the heat transfer structure 710 may include a plurality of hollow fins 730, which may be arranged in a regular or irregular array or a plurality of arrays spanning a desired length along the center axis. The hollow fins 730 may be implemented as hollow blades, vanes, and/or any other hollow structures suitable for the generation of axial flow. As previously described a working fluid may be contained in the hollow regions of the fins. The working fluid may include both a liquid phase and a vapor phase residing on each side of a liquid/vapor interface 790. The hollow finned structure 710 would therefore include a liquid space region 770 on one side of the liquid/vapor interface 790 and extending to the tips of the fins, and a vapor space region 780 on the other side of the liquid/vapor interface 790 and extending to the air gap surface 750.

In operation, heated air or other suitable heat transfer medium may flow substantially axially through the finned heat transfer structure (e.g. through the flow passages 795). Heat may be transferred from the warm air stream (or other heated flow) to the finned array 710. Heat transferred to the finned array may cause the working fluid residing in the liquid space region 770 to boil. The resulting vapor bubbles may migrate in the inner radial direction because of their centripetal buoyancy. Once delivered to the vapor space region 780 the vapor may be converted back to liquid by condensing on the air gap surface 750. The heat delivered to the air gap surface 750 may then be transferred across the air gap region 760, which in this example may have the shape of a thin-walled cylinder, to the cold object 720 (e.g. the heat conducting structure).

The condensate may be pumped by centrifugal force back to the liquid space region 770 of hollow-fin heat transfer structure 710. In this manner, and similar to the device of FIG. 6, heat and working fluid vapor may be transported in the inward radial direction, while condensed working fluid may be transported in the outward radial direction. However, by reversing the location of the air gap surface 760, thermal management needs of various systems and devices may be accommodated.

For example, an "inside-out" axial flow heat exchanger may be built around a 50-cm-diameter cylindrical stationary structure 720 containing one or more elements capable of absorbing large quantities of heat, such as an HVAC evaporator. This stationary, cylindrical, heat sink may be surrounded by the coaxial rotating heat transfer structure of annular cross section 710, as described above. Many other structures or devices may be implemented to function as the heat conducting structure 720 (or heat sink) provided they are configured to maintain a low temperature surface 740 to facilitate the heat transfer process across the gap. The gap region may, as previously discussed, have a width selected to provide low thermal resistance to the heat transfer process between the surface 750 and the surface 740 of the cold object 720. Furthermore, the working fluid contained in the hollow finned array may be selected to have a desired boiling and condensation properties suitable for the particular application. Other design considerations, which may affect the performance of such rotary heat exchanger devices, and which may be accounted for in the particular configuration, may include physical effects resulting from a rotating architecture, such as variation of the fluid boiling point as a function of radial position due to continuously varying centrifugal hydrostatic pressure, or enhanced buoyancy effects with regard to natural convection in the liquid space.

As can be appreciated, other configurations may be implemented and the flow direction may be altered or flow path narrowed, as desired for the particular application. In most applications, one or more adapter fittings may be used to connect a device having such an annular-shaped flow path to existing and/or standard duct work (e.g. of circular or rectangular cross section). Furthermore, and as described herein, rotary heat exchanger devices according to the present disclosure may be easily scaled for increased capacity. For example, parameters such as the diameter of the structures, their length, the specific design of the fins, and other characteristics can be varied within the scope of the present disclosure.

Figure 8:
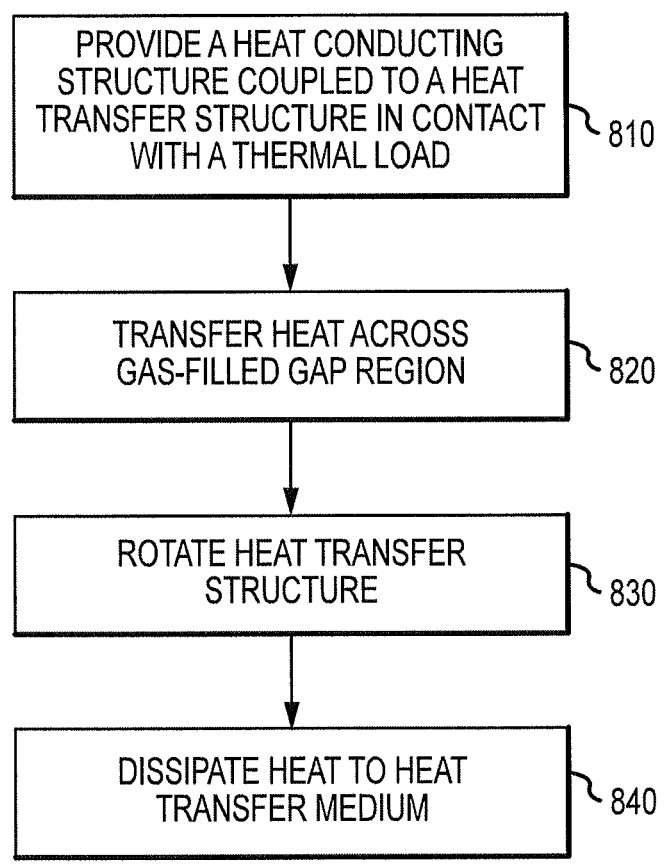
FIG. 8 is a diagram of a method of transferring heat to a medium flowing axially within a duct according to one embodiment of the present invention.

Methods for using axial flow heat exchangers are described further below. FIG. 8 is a diagram of an example method of transferring heat to a medium flowing axially within a duct. As shown in box 810, the method may include providing a heat conducting structure in thermal contact with a thermal load and coupling the heat conducting structure to a heat transfer structure. The method may further include transferring heat across a gas-filled gap region, as shown in box 820, and rotating the heat transfer structure through a heat transfer medium, as shown in box 830 to dissipate heat to the heat transfer medium, as shown in box 840.

As previously described, the heat conducting structure and heat transfer structure may be coupled such that they form the gas-filled gap region therebetween. The gas-filled gap region may be configured to have low thermal resistance, for example by selecting the width of the gap and the gas filling the gap such that the configuration does not impose a thermal resistance penalty on the device.

As previously described, the heat transfer structure may be operable to rotate relative to the heat conducting structure, during operation of the device. Heat may be transferred from the heat conducting structure across the gap region to the rotating heat transfer structure. As described herein, the heat transfer structure may be coupled to a motor, for example, configured to provide the desired rotation. The heat transfer structure may be provided with a plurality of structures adapted to the generation of axial flow such that during rotation of the heat transfer structure, the heat transfer medium flows in a substantially axial direction through the heat transfer structure.

In some examples, the steps of providing a heat conducting structure in thermal contact with a thermal load may include placing the heat conducting structure in direct physical contact with or adjacent a heat source, such as a heating element or a condenser coil, as examples. In other examples, providing the heat conducting structure in thermal contact with a thermal load may include placing the heat conducting structure, which may preferably be made of a thermally conductive material, in contact with a thermal load from a conventional computer system. And in other examples, the thermal load may reside in the rotating frame of the heat transfer structure (e.g. attached directly to surface 320 of FIG. 3) thereby eliminating the need to transfer heat across an air gap region, and eliminating the need for an air bearing. Such embodiments may be applicable to cooling of rotating components that require thermal management, such as the rotors of wire-wound-rotor motors and generators, for example.

Figure 9:
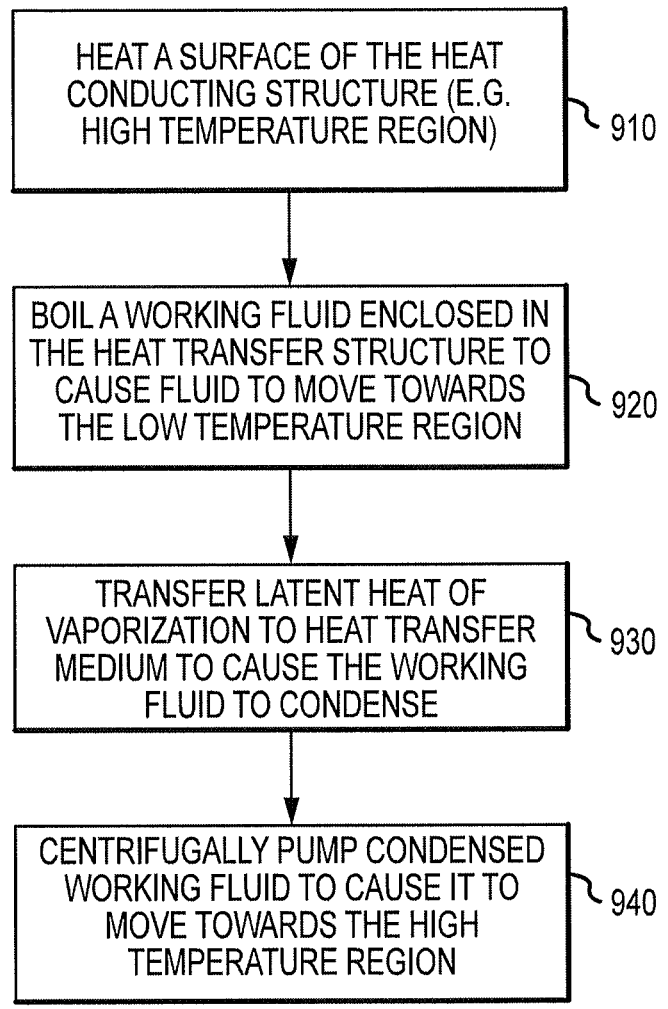
FIG. 9 is a diagram of a method of heat transfer using axial flow heat exchangers according to an embodiment of the present invention.

As shown in FIG. 9, in some examples, providing a heat conducting structure in thermal contact with a thermal load may include heating a first surface of a heat conducting structure (box 910) which is made of a thermally conductive material and/or includes heat pipe technology. The heat conducting structure may be the high temperature region of a heat pipe. Heating the first surface, which may be opposite and substantially parallel to the gas-filled gap region, may cause heat to be conducted through the heat conducting structure and across the gas-filled gap region. As described in detail above, heat conducting structures and heat transfer structures according to embodiments of the present invention may utilize heat pipe technology, and may accordingly include a working fluid in partial vacuum enclosed interior to the heat conducting structures and heat transfer structures. As such, heat transferred across the gas-filled gap region, may consequently heat a surface of the heat transfer structure to cause the working fluid interior to the heat transfer structure to boil (box 920). As would be appreciated by those skilled in the art, boiling the working fluid may cause at least a portion of the working fluid to evaporate (e.g. absorb a latent heat of vaporization) and move towards the low temperature region of the device.

Subsequently, dissipating heat may involve the steps of heating the heat transfer medium. That is, latent heat of vaporization may be transferred across a surface of the heat transfer structure to the heat transfer medium thereby heating the heat transfer medium and consequently the working fluid may condense (box 930). The condensing working fluid may thereafter be centrifugally pumped back towards the high temperature region by virtue of the rotation of the heat transfer structure within which the working fluid is enclosed (box 940).

In some examples, the heat conducting structure and heat transfer structure may be cylindrical devices made of a thermally conductive material, such as copper, aluminum, or other suitable metallic material. In some examples, the cylindrical heat conducting structure may have a diameter which is larger than the cylindrical heat transfer structure. In such embodiments, the heat conducting structure may be exterior to the heat transfer structure and the higher temperature region may be located in the outer perimeter of the axial flow heat exchanger. In such examples, the step of transferring heat across the gas-filled gap region may include transporting heat in a radially inward direction and dissipating heat may include the steps of heating a region which is interior to the heat conducting structure.

In other examples, the cylindrical heat conducting structure may have a diameter which is smaller than the cylindrical heat transfer structure. In such a configuration, the heat conducting structure may be interior to the heat transfer structure and accordingly, the higher temperature region may be located in the inner region of the axial flow heat exchanger. In such examples, the step of transferring heat across the gas-filled gap region comprises transporting heat in a radially outward direction and the step of dissipating heat may involve heating an annular-shaped region exterior to the heat conducting structure.

As described herein, axial flow heat exchanger devices may be implemented to either cool an exterior region of the device or heat the exterior region depending on the arrangement of the components (e.g. relative locations of the heat conducting structure and heat transfer structure). Advantages as the ones described herein may be achieved by axial flow heat exchanger devices and methods for making and using such device according to embodiments of the present invention. While some embodiments of the present invention may provide advantages described herein or address problems discussed herein, the advantages and problems herein are provided for ease of illustration and understanding, and it is to be understood that some examples of the invention may not provide any or all of the benefits described herein or address any or all of the drawbacks identified in the art.

Another advantage of an axial flow device may be the ease with which structures adapted for automatic and passive retraction of the inner air bearing surface at low speed (e.g. to prevent mechanical contact in the absence of hydrodynamic lifting force) may be implemented. As described previously, and referring back to FIGS. 4 and 5, the heat transfer structure 420 may be implemented as a double-walled cylinder 520, with an outer cylindrical wall 560 connected to the remainder of the rotating structure by an accordion-shaped metal flexure or bellows 485. In this manner, a region 445 having an annular cross section may be defined, and the region 445 may be partially filled with a working fluid to function as a heat pipe, as previously described.

The rotating structure (e.g. the heat transfer structure 420) may be supported by a gas bearing and/or conventional bearings 455. The air gap distance 530, which may be the same or which may vary along the length of the heat transfer structure, may be selected to provide large mechanical clearance under non-operating conditions. That is, when the heat transfer structure is stationary, the surfaces of the heat transfer structure would not be loaded, either thermally or centrifugally, and the outermost cylindrical wall 560 would be in a retracted position closest to the inner cylindrical wall 550. Under rotation, the radial flexure may expand in the outward direction by centrifugal force. At sufficiently high rpm, outward expansion of the rotating gap surface may eventually be arrested by the inward force generated by the air bearing, thereby providing the desired self-regulating-air-gap-distance effect between the rotating gap surface and the stationary gap surface. In accordance with such embodiments, the outer wall of the rotating heat pipe may be designed to be thin and flexible enough to allow it to readily conform to the inner surface of the opposing wall of the air gap region, thereby assuring a substantially uniform air gap distance. Other portions of the rotating heat pipe (such as the inner wall of the fluid-containing region of annular cross section) may be designed to ensure a high degree of stiffness for the rotating structure as a whole.

A representative embodiment of a device according to embodiments of the present invention may also incorporate a motor, for example a 3-phase, 6-pole brushless motor assembly, adapted to impart rotation to the heat transfer structure. It should be understood that a wide variety of other means could be used to impart rotation to the heat transfer structure. Multiple axial-flow air bearing heat exchangers, plumbed in series and/or parallel may also be connected by shafts, belts, gears, etc. to one or more structures adapted to impart rotation. In an alternative embodiment, one or more free-wheeling rotating heat transfer structures having no motor may be compelled to rotate by ducted air flow generated elsewhere (e.g. by one or more axial-flow air bearing heat exchangers located elsewhere, one or more dedicated and/or pre-existing HVAC blowers, etc.).

Axial flow air bearing heat exchangers such as those described above may also be used in conjunction with one or more stationary heat transfer structures, wherein such structures may be internal to an axial flow air bearing heat exchanger module (e.g. stator blades), or external to an axial flow air bearing heat exchanger module (e.g. conventional in-line finned heat exchangers).

In a representative embodiment as described herein, heat from a thermal load such as an HVAC condenser coil may be conveyed to a flowing stream of air internal to one or more ducted fixtures. Heat flow may be in the inward radial direction, such that the outer-most portion of the rotating heat pipe structures may comprise the hot end (evaporator) of the rotating heat pipe structure. Such a configuration may enjoy the benefits of centrifugal pumping for return of condensed working fluid from the cold to side of the heat pipe.

While some embodiments of the present invention may provide advantages described herein or address problems discussed herein, the advantages and problems herein are provided for ease of illustration and understanding, and it is to be understood that some examples of the invention may not provide any or all of the benefits described herein or address any or all of the drawbacks identified in the art.

As described herein, rotary heat exchanger devices, such as the axial flow device 100, may be advantageous for example, because the inline flow path configuration may be well suited to many applications including HVAC, etc. In some examples, such inline arrangement may provide some or all of blower functionality (i.e. no additional impellers needed to move fluid), which may result in further energy savings. In some examples, an axial flow, as compared to radial flow, configuration may readily achieve very large heat exchanger surface areas. Also, as would be appreciated by those skilled in the art, air gap regulation may be achieved by passive (e.g. self-regulating) mechanisms, such as the centrifugal flexure described above, for example. Moreover, in some examples, high performance centrifugal heat pipe functionality, as described herein, can be implemented. Such centrifugal pumping may minimize and/or eliminate the need for internal capillary structures (e.g. sintered metal capillary structures), which can be costly and limit the life span of the system.

From the foregoing it will be appreciated that, although specific embodiments of the invention have been described herein for purposes of illustration, it will be understood by those skilled in the art that various modifications may be made without deviating from the spirit and scope of the invention. Accordingly, the invention is not limited except as by the appended claim.

What is claimed is:

1. A heat exchanger having a length and a center axis substantially parallel to the length, the heat exchanger comprising:
    a heat conducting structure comprising a first cylinder, the first cylinder comprising a first cylindrical surface; and
    a heat transfer structure comprising a second cylinder rotatably coupled to the first cylinder to form a gas-filled gap region between the first cylindrical surface of the heat conducting structure and a second cylindrical surface of the heat transfer structure, wherein the second cylinder comprises a first cylindrical wall and a second cylindrical wall parallel to the first cylindrical wall, the first and second cylindrical walls defining a cylindrical region therebetween, and wherein the second cylinder further comprises a plurality of hollow fins disposed inside the second cylinder and configured to rotate about the center axis and to generate flow of a heat transfer medium in a substantially axial direction, the plurality of hollow fins comprising a plurality of respective inner regions, wherein the plurality of hollow fins are attached to the second wall of the second cylinder such that at least one of the inner regions of the fins is fluidly coupled with the cylindrical region of the heat transfer structure.

2. The heat exchanger of claim 1 wherein the heat conducting structure comprises at least one of a metallic material, a heat pipe, or a vapor chamber.

3. The heat exchanger of claim 1 wherein the heat transfer structure is configured to function as a heat pipe.

4. The heat exchanger of claim 1 wherein at least a portion of the heat transfer structure is disposed inside the heat conducting structure.

5. The heat exchanger of claim 1 wherein at least a portion of the heat conducting structure is disposed inside the heat transfer structure.

6. The heat exchanger of claim 1 wherein the gap region comprises a gas maintained at a pressure selected to counteract forces applied to the second surface during rotation of the heat transfer structure.

7. The heat exchanger of claim 1 further comprising a motor coupled to the heat transfer structure and configured to rotate the heat transfer structure relative to the heat conducting structure about a common longitudinal axis of the heat conducting structure and the heat transfer structure.

8. The heat exchanger of claim 1 wherein the first cylindrical wall and the second cylindrical wall are connected by a cap, wherein the cap comprises at least one of a bellows, a flexure, or a corrugated wall.

\* \* \* \* \*